(12) United States Patent
McFarland et al.

(10) Patent No.: US 10,613,559 B2
(45) Date of Patent: *Apr. 7, 2020

(54) APPARATUS, SYSTEMS AND METHODS FOR GENERATING VOLTAGE EXCITATION WAVEFORMS

(71) Applicant: Radio Systems Corporation, Knoxville, TN (US)

(72) Inventors: Scott A McFarland, Knoxville, TN (US); Keith R. Griffith, Knoxville, TN (US)

(73) Assignee: RADIO SYSTEMS CORPORATION, Knoxville, TN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/295,231

(22) Filed: Mar. 7, 2019

(65) Prior Publication Data

US 2019/0204860 A1 Jul. 4, 2019

Related U.S. Application Data

(63) Continuation of application No. 15/210,498, filed on Jul. 14, 2016, now Pat. No. 10,268,220.

(51) Int. Cl.
*G05F 1/46* (2006.01)
*G01R 19/02* (2006.01)
(Continued)

(52) U.S. Cl.
CPC ............ *G05F 1/468* (2013.01); *A01K 15/023* (2013.01); *G01R 19/02* (2013.01); *H04B 1/04* (2013.01)

(58) Field of Classification Search
CPC .......... G05F 1/46; G05F 1/468; G01R 19/02; G01R 19/03
(Continued)

(56) References Cited

U.S. PATENT DOCUMENTS 2,741,224 A 4/1956 Putnam
3,182,211 A 5/1965 Maratuech et al.
(Continued)

FOREIGN PATENT DOCUMENTS

CN 101112181 A 1/2008
CN 101937015 A 1/2011
(Continued)

OTHER PUBLICATIONS

Extended European Search Report for Application No. EP17180645, dated May 9, 2018, 7 pages.
(Continued)

*Primary Examiner* — Lincoln D Donovan
*Assistant Examiner* — Diana J. Cheng
(74) *Attorney, Agent, or Firm* — Baker, Donelson, Bearman, Caldwell & Berkowitz PC

(57) ABSTRACT

A method described herein includes describing a load current with a discrete time function. The method includes using a first frequency and a second frequency to provide an approximation of the described load current, wherein a transform applied to the discrete time function identifies the first frequency and the second frequency. The method includes estimating a loop inductance and a loop resistance of a wire loop by exciting a transmit circuit with a voltage reference step waveform, wherein the transmit circuit includes the wire loop. The method includes scaling the approximated load current to a level sufficient to generate a minimum receive voltage signal in a receiver at a first distance between the wire loop and the receiver. The method includes generating a first voltage signal using the scaled load current, estimated loop inductance, and estimated loop resistance. The method includes exciting the transmit circuit with the first voltage signal.

33 Claims, 21 Drawing Sheets

(51) Int. Cl.
*H04B 1/04* (2006.01)
*A01K 15/02* (2006.01)

(58) Field of Classification Search
USPC .................................................. 327/306–333
See application file for complete search history.

(56) References Cited

U.S. PATENT DOCUMENTS

| | | |
|---|---|---|
| 3,184,730 A | 5/1965 | Irish |
| 3,500,373 A | 3/1970 | Arthur |
| 3,735,757 A | 5/1973 | MacFarland |
| 4,426,884 A | 1/1984 | Polchaninoff |
| 4,783,646 A | 11/1988 | Matsuzaki |
| 4,794,402 A | 12/1988 | Gonda et al. |
| 4,802,482 A | 2/1989 | Gonda et al. |
| 4,947,795 A | 8/1990 | Farkas |
| 4,969,418 A | 11/1990 | Jones |
| 5,054,428 A | 10/1991 | Farkus |
| 5,159,580 A | 10/1992 | Andersen et al. |
| 5,161,485 A | 11/1992 | McDade |
| 5,182,032 A | 1/1993 | Dickie et al. |
| 5,207,178 A | 5/1993 | McDade et al. |
| 5,207,179 A | 5/1993 | Arthur et al. |
| 5,526,006 A | 6/1996 | Akahane et al. |
| 5,559,498 A | 9/1996 | Westrick et al. |
| 5,576,972 A | 11/1996 | Harrison |
| 5,586,521 A | 12/1996 | Kelley |
| 5,601,054 A | 2/1997 | So |
| 5,642,690 A | 7/1997 | Calabrese et al. |
| 5,794,569 A | 8/1998 | Titus et al. |
| 5,815,077 A | 9/1998 | Christiansen |
| 5,844,489 A | 12/1998 | Yarnall, Jr. et al. |
| 5,857,433 A | 1/1999 | Files |
| 5,870,029 A | 2/1999 | Otto et al. |
| 5,872,516 A | 2/1999 | Bonge, Jr. |
| 5,886,669 A | 3/1999 | Kita |
| 5,923,254 A | 7/1999 | Brune |
| 5,927,233 A | 7/1999 | Mainini et al. |
| 5,933,079 A | 8/1999 | Frink |
| 5,934,225 A | 8/1999 | Williams |
| 5,949,350 A | 9/1999 | Girard et al. |
| 5,957,983 A | 9/1999 | Tominaga |
| 5,982,291 A | 11/1999 | Williams et al. |
| 6,016,100 A | 1/2000 | Boyd et al. |
| 6,019,066 A | 2/2000 | Taylor |
| 6,028,531 A | 2/2000 | Wanderlich |
| 6,047,664 A | 4/2000 | Lyerly |
| 6,067,018 A | 5/2000 | Skelton et al. |
| 6,075,443 A | 6/2000 | Schepps et al. |
| 6,166,643 A | 12/2000 | Janning et al. |
| 6,170,439 B1 | 1/2001 | Duncan et al. |
| 6,184,790 B1 | 2/2001 | Gerig |
| 6,196,990 B1 | 3/2001 | Zicherman |
| 6,204,762 B1 | 3/2001 | Dering et al. |
| 6,215,314 B1 | 4/2001 | Frankewich, Jr. |
| 6,230,031 B1 | 5/2001 | Barber |
| 6,230,661 B1 | 5/2001 | Yarnall, Jr. et al. |
| 6,232,880 B1 | 5/2001 | Anderson et al. |
| 6,271,757 B1 | 8/2001 | Touchton et al. |
| 6,327,999 B1 | 12/2001 | Gerig |
| 6,353,390 B1 | 3/2002 | Beri et al. |
| 6,360,697 B1 | 3/2002 | Williams |
| 6,360,698 B1 | 3/2002 | Stapelfeld et al. |
| 6,404,338 B1 | 6/2002 | Koslar |
| 6,415,742 B1 | 7/2002 | Lee et al. |
| 6,426,464 B1 | 7/2002 | Spellman et al. |
| 6,427,079 B1 | 7/2002 | Schneider et al. |
| 6,431,121 B1 | 8/2002 | Mainini et al. |
| 6,431,122 B1 | 8/2002 | Westrick et al. |
| 6,441,778 B1 | 8/2002 | Durst et al. |
| 6,459,378 B2 | 10/2002 | Gerig |
| 6,487,992 B1 | 12/2002 | Hollis |
| 6,561,137 B2 | 5/2003 | Oakman |
| 6,581,546 B1 | 6/2003 | Dalland et al. |
| 6,588,376 B1 | 7/2003 | Groh |
| 6,598,563 B2 | 7/2003 | Kim et al. |
| 6,600,422 B2 | 7/2003 | Barry et al. |
| 6,637,376 B2 | 10/2003 | Lee et al. |
| 6,657,544 B2 | 12/2003 | Barry et al. |
| 6,668,760 B2 | 12/2003 | Groh et al. |
| 6,700,492 B2 | 3/2004 | Touchton et al. |
| 6,747,555 B2 | 6/2004 | Fellenstein et al. |
| 6,799,537 B1 | 10/2004 | Liao |
| 6,807,720 B2 | 10/2004 | Brune et al. |
| 6,820,025 B2 | 11/2004 | Bachmann et al. |
| 6,825,768 B2 | 11/2004 | Stapelfeld et al. |
| 6,830,012 B1 | 12/2004 | Swan |
| 6,833,790 B2 | 12/2004 | Mejia et al. |
| 6,874,447 B1 | 4/2005 | Kobett |
| 6,888,502 B2 | 5/2005 | Beigel et al. |
| 6,901,883 B2 | 6/2005 | Gillis et al. |
| 6,903,682 B1 | 6/2005 | Maddox |
| 6,907,844 B1 | 6/2005 | Crist et al. |
| 6,907,883 B2 | 6/2005 | Lin |
| 6,921,089 B2 | 7/2005 | Groh et al. |
| 6,923,146 B2 | 8/2005 | Korbitz et al. |
| 6,928,958 B2 | 8/2005 | Crist et al. |
| 6,937,647 B1 | 8/2005 | Boyd et al. |
| 6,956,483 B2 | 10/2005 | Schmitt et al. |
| 6,970,090 B1 | 11/2005 | Sciarra |
| 7,061,385 B2 | 6/2006 | Fong et al. |
| 7,079,024 B2 | 7/2006 | Alarcon et al. |
| 7,114,466 B1 | 10/2006 | Mayer |
| 7,142,167 B2 | 11/2006 | Rochelle et al. |
| 7,164,354 B1 | 1/2007 | Panzer |
| 7,173,535 B2 | 2/2007 | Bach et al. |
| 7,198,009 B2 | 4/2007 | Crist et al. |
| 7,222,589 B2 | 5/2007 | Lee, IV et al. |
| 7,249,572 B2 | 7/2007 | Goetzl et al. |
| 7,252,051 B2 | 8/2007 | Napolez et al. |
| 7,259,718 B2 | 8/2007 | Patterson et al. |
| 7,267,081 B2 | 9/2007 | Steinbacher |
| 7,275,502 B2 | 10/2007 | Boyd et al. |
| 7,296,540 B2 | 11/2007 | Boyd |
| 7,319,397 B2 | 1/2008 | Chung et al. |
| 7,328,671 B2 | 2/2008 | Kates |
| 7,339,474 B2 | 3/2008 | Easley et al. |
| 7,382,328 B2 | 6/2008 | Lee, IV et al. |
| 7,394,390 B2 | 7/2008 | Gerig |
| 7,395,966 B2 | 7/2008 | Braiman |
| 7,404,379 B2 | 7/2008 | Nottingham et al. |
| 7,411,492 B2 | 8/2008 | Greenberg et al. |
| 7,426,906 B2 | 9/2008 | Nottingham et al. |
| 7,434,541 B2 | 10/2008 | Kates |
| 7,443,298 B2 | 10/2008 | Cole et al. |
| 7,477,155 B2 | 1/2009 | Bach et al. |
| 7,503,285 B2 | 3/2009 | Mainini et al. |
| 7,518,275 B2 | 4/2009 | Suzuki et al. |
| 7,518,522 B2 | 4/2009 | So et al. |
| 7,538,679 B2 | 5/2009 | Shanks |
| 7,546,817 B2 | 6/2009 | Moore |
| 7,552,699 B2 | 6/2009 | Moore |
| 7,562,640 B2 | 7/2009 | Lalor |
| 7,565,885 B2 | 7/2009 | Moore |
| 7,574,979 B2 | 8/2009 | Nottingham et al. |
| 7,583,931 B2 | 9/2009 | Eu et al. |
| 7,602,302 B2 | 10/2009 | Hokuf et al. |
| 7,612,668 B2 | 11/2009 | Harvey |
| 7,616,124 B2 | 11/2009 | Paessel et al. |
| 7,656,291 B2 | 2/2010 | Rochelle et al. |
| 7,667,599 B2 | 2/2010 | Mainini et al. |
| 7,667,607 B2 | 2/2010 | Gerig et al. |
| 7,680,645 B2 | 3/2010 | Li et al. |
| 7,705,736 B1 | 4/2010 | Kedziora |
| 7,710,263 B2 | 5/2010 | Boyd |
| 7,760,137 B2 | 7/2010 | Martucci et al. |
| 7,779,788 B2 | 8/2010 | Moore |
| 7,786,876 B2 | 8/2010 | Troxler et al. |
| 7,804,724 B2 | 9/2010 | Way |
| 7,814,865 B2 | 10/2010 | Tracy et al. |
| 7,828,221 B2 | 11/2010 | Kwon |
| 7,830,257 B2 | 11/2010 | Hassell |
| 7,834,769 B2 | 11/2010 | Hinkle et al. |
| 7,841,301 B2 | 11/2010 | Mainini et al. |

(56) References Cited

U.S. PATENT DOCUMENTS

| | | |
|---|---|---|
| 7,856,947 B2 | 12/2010 | Giunta |
| 7,864,057 B2 | 1/2011 | Milnes et al. |
| 7,868,912 B2 | 1/2011 | Venetianer et al. |
| 7,900,585 B2 | 3/2011 | Lee et al. |
| 7,918,190 B2 | 4/2011 | Belcher et al. |
| 7,944,359 B2 | 5/2011 | Fong et al. |
| 7,946,252 B2 | 5/2011 | Lee, IV et al. |
| 7,978,078 B2 | 7/2011 | Copeland et al. |
| 7,996,983 B2 | 8/2011 | Lee et al. |
| 8,011,327 B2 | 9/2011 | Mainini et al. |
| 8,047,161 B2 | 11/2011 | Moore et al. |
| 8,049,630 B2 | 11/2011 | Chao et al. |
| 8,065,978 B2 | 11/2011 | Duncan et al. |
| 8,069,823 B2 | 12/2011 | Mainini et al. |
| 8,098,164 B2 | 1/2012 | Gerig et al. |
| 8,159,355 B2 | 4/2012 | Gerig et al. |
| 8,185,345 B2 | 5/2012 | Mainini |
| 8,232,909 B2 | 7/2012 | Kroeger et al. |
| 8,240,085 B2 | 8/2012 | Hill |
| 8,269,504 B2 | 9/2012 | Gerig |
| 8,274,396 B2 | 9/2012 | Gurley et al. |
| 8,297,233 B2 | 10/2012 | Rich et al. |
| 8,342,134 B2 | 1/2013 | Lee et al. |
| 8,342,135 B2 | 1/2013 | Peinetti et al. |
| 8,430,064 B2 | 4/2013 | Groh et al. |
| 8,436,735 B2 | 5/2013 | Mainini et al. |
| 8,447,510 B2 | 5/2013 | Fitzpatrick et al. |
| 8,451,130 B2 | 5/2013 | Mainini |
| 8,456,296 B2 | 6/2013 | Piltonen et al. |
| 8,483,262 B2 | 7/2013 | Mainini et al. |
| 8,714,113 B2 | 5/2014 | Lee, IV et al. |
| 8,715,824 B2 | 5/2014 | Rawlings et al. |
| 8,736,499 B2 | 5/2014 | Goetzl et al. |
| 8,779,925 B2 | 7/2014 | Rich et al. |
| 8,803,692 B2 | 8/2014 | Goetzl et al. |
| 8,807,089 B2 | 8/2014 | Brown et al. |
| 8,823,513 B2 | 9/2014 | Jameson et al. |
| 8,854,215 B1 | 10/2014 | Ellis et al. |
| 8,866,605 B2 | 10/2014 | Gibson |
| 8,908,034 B2 | 12/2014 | Bordonaro |
| 8,917,172 B2 | 12/2014 | Charych |
| 8,947,240 B2 | 2/2015 | Mainini |
| 8,967,085 B2 | 3/2015 | Gillis et al. |
| 9,035,773 B2 | 5/2015 | Petersen et al. |
| 9,125,380 B2 | 9/2015 | Deutsch |
| 9,131,660 B2 | 9/2015 | Womble |
| 9,186,091 B2 | 11/2015 | Mainini et al. |
| 9,204,251 B1 | 12/2015 | Mendelson et al. |
| 9,307,745 B2 | 4/2016 | Mainini |
| 9,861,076 B2 | 1/2018 | Rochelle et al. |
| 2002/0010390 A1 | 1/2002 | Guice et al. |
| 2002/0015094 A1 | 2/2002 | Kuwano et al. |
| 2002/0036569 A1 | 3/2002 | Martin |
| 2002/0092481 A1 | 7/2002 | Spooner |
| 2002/0103610 A1 | 8/2002 | Bachmann et al. |
| 2002/0196151 A1 | 12/2002 | Troxler |
| 2003/0034887 A1 | 2/2003 | Crabtree et al. |
| 2003/0035051 A1 | 2/2003 | Cho et al. |
| 2003/0116099 A1 | 6/2003 | Kim et al. |
| 2003/0169207 A1 | 9/2003 | Beigel et al. |
| 2003/0179140 A1 | 9/2003 | Patterson et al. |
| 2003/0218539 A1 | 11/2003 | Hight |
| 2004/0108939 A1 | 6/2004 | Giunta |
| 2004/0162875 A1 | 8/2004 | Brown |
| 2005/0000469 A1 | 1/2005 | Giunta et al. |
| 2005/0007251 A1 | 1/2005 | Crabtree et al. |
| 2005/0020279 A1 | 1/2005 | Markhovsky et al. |
| 2005/0035865 A1 | 2/2005 | Brennan et al. |
| 2005/0059909 A1 | 3/2005 | Burgess |
| 2005/0066912 A1 | 3/2005 | Korbitz et al. |
| 2005/0081797 A1 | 4/2005 | Laitinen et al. |
| 2005/0139169 A1 | 6/2005 | So et al. |
| 2005/0145196 A1 | 7/2005 | Crist et al. |
| 2005/0145198 A1 | 7/2005 | Crist et al. |
| 2005/0145200 A1 | 7/2005 | Napolez et al. |
| 2005/0172912 A1 | 8/2005 | Crist et al. |
| 2005/0217606 A1 | 10/2005 | Lee et al. |
| 2005/0231353 A1 | 10/2005 | Dipoala et al. |
| 2005/0235924 A1 | 10/2005 | Lee, IV et al. |
| 2005/0258715 A1 | 11/2005 | Schlabach et al. |
| 2005/0263106 A1 | 12/2005 | Steinbacher |
| 2005/0280546 A1 | 12/2005 | Ganley |
| 2005/0288007 A1 | 12/2005 | Benco et al. |
| 2006/0000015 A1 | 1/2006 | Duncan |
| 2006/0011145 A1 | 1/2006 | Kates et al. |
| 2006/0027185 A1 | 2/2006 | Troxler et al. |
| 2006/0092676 A1 | 5/2006 | Liptak et al. |
| 2006/0102101 A1 | 5/2006 | Kim |
| 2006/0112901 A1 | 6/2006 | Gomez |
| 2006/0191491 A1 | 8/2006 | Nottingham et al. |
| 2006/0196445 A1 | 9/2006 | Kates |
| 2006/0197672 A1 | 9/2006 | Talamas, Jr. et al. |
| 2006/0202818 A1 | 9/2006 | Greenberg et al. |
| 2007/0011339 A1 | 1/2007 | Brown |
| 2007/0103296 A1 | 5/2007 | Paessel et al. |
| 2007/0204803 A1 | 9/2007 | Ramsay |
| 2007/0204804 A1 | 9/2007 | Swanson et al. |
| 2007/0249470 A1 | 10/2007 | Niva et al. |
| 2007/0266959 A1 | 11/2007 | Brooks et al. |
| 2008/0004539 A1 | 1/2008 | Ross |
| 2008/0017133 A1 | 1/2008 | Moore |
| 2008/0036610 A1 | 2/2008 | Hokuf et al. |
| 2008/0055154 A1 | 3/2008 | Martucci et al. |
| 2008/0055155 A1 | 3/2008 | Hensley et al. |
| 2008/0058670 A1 | 3/2008 | Mainini et al. |
| 2008/0061978 A1 | 3/2008 | Huang |
| 2008/0061990 A1 | 3/2008 | Milnes et al. |
| 2008/0119757 A1 | 5/2008 | Winter |
| 2008/0129457 A1 | 6/2008 | Ritter et al. |
| 2008/0141949 A1 | 6/2008 | Taylor |
| 2008/0143516 A1 | 6/2008 | Mock et al. |
| 2008/0156277 A1 | 7/2008 | Mainini et al. |
| 2008/0163827 A1 | 7/2008 | Goetzl |
| 2008/0163829 A1 | 7/2008 | Lee et al. |
| 2008/0168949 A1 | 7/2008 | Belcher et al. |
| 2008/0168950 A1 | 7/2008 | Moore et al. |
| 2008/0186167 A1 | 8/2008 | Ramachandra |
| 2008/0186197 A1 | 8/2008 | Rochelle et al. |
| 2008/0204322 A1 | 8/2008 | Oswald et al. |
| 2008/0236514 A1 | 10/2008 | Johnson et al. |
| 2008/0252527 A1 | 10/2008 | Garcia |
| 2008/0272908 A1 | 11/2008 | Boyd |
| 2009/0000566 A1 | 1/2009 | Kim |
| 2009/0002188 A1 | 1/2009 | Greenberg |
| 2009/0012355 A1 | 1/2009 | Lin |
| 2009/0020002 A1 | 1/2009 | Williams et al. |
| 2009/0025651 A1 | 1/2009 | Lalor |
| 2009/0031966 A1 | 2/2009 | Kates |
| 2009/0082830 A1 | 3/2009 | Folkerts et al. |
| 2009/0102668 A1 | 4/2009 | Thompson et al. |
| 2009/0224909 A1 | 9/2009 | Derrick et al. |
| 2009/0239586 A1 | 9/2009 | Boeve et al. |
| 2009/0289785 A1 | 11/2009 | Leonard |
| 2009/0289844 A1 | 11/2009 | Palsgrove et al. |
| 2010/0008011 A1 | 1/2010 | Ogram |
| 2010/0033339 A1 | 2/2010 | Gurley et al. |
| 2010/0047119 A1 | 2/2010 | Cressy |
| 2010/0049364 A1 | 2/2010 | Landry et al. |
| 2010/0107985 A1 | 5/2010 | O'Hare |
| 2010/0139576 A1 | 6/2010 | Kim et al. |
| 2010/0154721 A1 | 6/2010 | Gerig et al. |
| 2010/0231391 A1 | 9/2010 | Dror et al. |
| 2010/0238022 A1 | 9/2010 | Au et al. |
| 2010/0315241 A1 | 12/2010 | Jow |
| 2011/0140967 A1 | 6/2011 | Lopez et al. |
| 2012/0000431 A1 | 1/2012 | Khoshkish et al. |
| 2012/0006282 A1 | 1/2012 | Kates |
| 2012/0037088 A1 | 2/2012 | Altenhofen |
| 2012/0078139 A1* | 3/2012 | Aldridge ........ A61B 17/320092 601/2 |
| 2012/0132151 A1 | 5/2012 | Touchton et al. |
| 2012/0165012 A1 | 6/2012 | Fischer et al. |
| 2012/0188370 A1 | 7/2012 | Bordonaro |
| 2012/0236688 A1 | 9/2012 | Spencer et al. |

(56) References Cited

U.S. PATENT DOCUMENTS

| | | |
|---|---|---|
| 2012/0312250 A1 | 12/2012 | Jesurum |
| 2013/0099920 A1 | 4/2013 | Song et al. |
| 2013/0099922 A1 | 4/2013 | Lohbihler |
| 2013/0141237 A1 | 6/2013 | Goetzl et al. |
| 2013/0157564 A1 | 6/2013 | Curtis et al. |
| 2013/0169441 A1 | 7/2013 | Wilson |
| 2013/0321159 A1 | 12/2013 | Schofield et al. |
| 2014/0020635 A1 | 1/2014 | Sayers et al. |
| 2014/0053788 A1 | 2/2014 | Riddell |
| 2014/0062695 A1 | 3/2014 | Rosen et al. |
| 2014/0069350 A1 | 3/2014 | Riddell |
| 2014/0073939 A1 | 3/2014 | Rodriguez-Llorente et al. |
| 2014/0120943 A1 | 5/2014 | Shima |
| 2014/0123912 A1 | 5/2014 | Menkes et al. |
| 2014/0132608 A1 | 5/2014 | Mund et al. |
| 2014/0174376 A1 | 6/2014 | Touchton et al. |
| 2014/0228649 A1 | 8/2014 | Rayner et al. |
| 2014/0253389 A1 | 9/2014 | Beauregard |
| 2014/0261235 A1 | 9/2014 | Rich et al. |
| 2014/0267299 A1 | 9/2014 | Couse |
| 2014/0275824 A1 | 9/2014 | Couse et al. |
| 2014/0320347 A1 | 10/2014 | Rochelle et al. |
| 2015/0040840 A1 | 2/2015 | Muetzel et al. |
| 2015/0053144 A1 | 2/2015 | Bianchi et al. |
| 2015/0075446 A1 | 3/2015 | Hu |
| 2015/0080013 A1 | 3/2015 | Venkatraman et al. |
| 2015/0107531 A1 | 4/2015 | Golden |
| 2015/0149111 A1 | 5/2015 | Kelly et al. |
| 2015/0163412 A1 | 6/2015 | Holley et al. |
| 2015/0172872 A1 | 6/2015 | Alsehly et al. |
| 2015/0173327 A1 | 6/2015 | Gerig et al. |
| 2015/0199490 A1 | 7/2015 | Iancu et al. |
| 2015/0223013 A1 | 8/2015 | Park et al. |
| 2015/0289111 A1 | 10/2015 | Ozkan et al. |
| 2015/0350848 A1 | 12/2015 | Eramian |
| 2016/0015005 A1 | 1/2016 | Brown, Jr. et al. |
| 2016/0021506 A1 | 1/2016 | Bonge, Jr. |
| 2016/0021850 A1 | 1/2016 | Stapelfeld et al. |
| 2016/0044444 A1 | 2/2016 | Rattner et al. |
| 2016/0094419 A1 | 3/2016 | Peacock et al. |
| 2016/0102879 A1 | 4/2016 | Guest et al. |
| 2016/0150362 A1 | 5/2016 | Shaprio et al. |
| 2016/0174099 A1 | 6/2016 | Goldfain |
| 2016/0178392 A1 | 6/2016 | Goldfain |
| 2016/0187454 A1 | 6/2016 | Orman et al. |
| 2016/0253987 A1 | 9/2016 | Chattell |
| 2016/0363664 A1 | 12/2016 | Mindell et al. |
| 2017/0323630 A1 | 11/2017 | Stickney et al. |
| 2018/0027772 A1 | 2/2018 | Gordon et al. |
| 2018/0094451 A1 | 4/2018 | Peter et al. |
| 2018/0234134 A1 | 8/2018 | Tang et al. |
| 2018/0235182 A1 | 8/2018 | Bocknek |
| 2018/0315262 A1 | 11/2018 | Love et al. |
| 2019/0013003 A1 | 1/2019 | Baughman et al. |
| 2019/0165832 A1 | 5/2019 | Khanduri et al. |

FOREIGN PATENT DOCUMENTS

| | | |
|---|---|---|
| CN | 101112181 B | 11/2012 |
| CN | 102793568 B | 12/2014 |
| JP | H0974774 A | 3/1997 |
| KR | 20130128704 A | 11/2013 |
| WO | WO-02060240 A3 | 2/2003 |
| WO | WO-2006000015 A1 | 1/2006 |
| WO | WO-2008085812 A2 | 7/2008 |
| WO | WO-2008140992 A1 | 11/2008 |
| WO | WO-2009105243 A2 | 8/2009 |
| WO | WO-2009106896 A2 | 9/2009 |
| WO | WO-2011055004 A1 | 5/2011 |
| WO | WO-2011136816 A1 | 11/2011 |
| WO | WO-2012122607 A1 | 9/2012 |
| WO | WO-2015015047 A1 | 2/2015 |
| WO | WO-2016204799 A1 | 12/2016 |

OTHER PUBLICATIONS

Baba A.I., et al., "Calibrating Time of Flight in Two Way Ranging," IEEE Xplore Digital Library, Dec. 2011, pp. 393-397.

Extended European Search Report for European Application No. 11784149.4 dated Nov. 17, 2017, 7 pages.

Extended European Search Report for European Application No. 15735439.0 dated Oct. 18, 2017, 9 pages.

Extended European Search Report for European Application No. 15895839.7 dated Oct. 9, 2018, 5 pages.

Extended European Search Report for European Application No. 17162289.7 dated Aug. 31, 2017, 7 pages.

High Tech Products, Inc: "Human Contain Model X-10 Rechargeable Muti-function Electronic Dog Fence Ultra-system", Internet citation, Retrieved from the Internet: URL:http://web.archive.org/web/20120112221915/http://hightechpet.com/user_Manuals/HC%20X-10_Press.pdf retrieved on Apr. 10, 2017], Apr. 28, 2012, pp. 1-32, XP008184171.

International Preliminary Report for Patentability Chapter II for International Application No. PCT/US2014/024875 dated Mar. 12, 2015, 17 pages.

International Preliminary Report on Patentability for Application No. PCT/US2015/043653 dated Dec. 19, 2017, 14 pages.

International Search Report and Written Opinion for Application No. PCT/US2018/013737 dated Mar. 7, 2018, 8 pages.

International Search Report and Written Opinion for Application No. PCT/US2018/013738 dated Mar. 20, 2018, 6 pages.

International Search Report and Written Opinion for Application No. PCT/US2018/013740 dated Mar. 20, 2018, 6 pages.

International Search Report and Written Opinion for Application No. PCT/US2018/019887 dated May 8, 2018, 10 pages.

International Search Report and Written Opinion for International Application No. PCT/US2014/024875 dated Jun. 27, 2014, 12 pages.

International Search Report for International Application No. PCT/US2014/020344 dated Jun. 5, 2014, 2 pages.

International Search Report for International Application No. PCT/US2014/066650 dated Feb. 19, 2015, 3 pages (Outgoing).

International Search Report for International Application No. PCT/US2015/010864, Form PCT/ISA/210 dated Apr. 13, 2015, 2 pages.

International Search Report for International Application No. PCT/US2015/043653, Form PCT/ISA/210 dated Oct. 23, 2015, 2 pages.

Notification of Transmittal of the International Search Report and the Written Opinion of the International Searching Authority for International Application No. PCT/US2015/043653, Form PCT/ISA/220 dated Oct. 23, 2015, 1 page.

Notification of Transmittal of the International Search Report and Written Opinion for the International Application No. PCT/US2014/066650 dated Feb. 19, 2015, 1 page.

Welch et al., "An Introduction to the Kalman Filter," Department of Computer Science, Jul. 24, 2006, pp. 1-16.

Written Opinion for International Application No. PCT/US2014/066650 dated Feb. 19, 2015, 15 pages(outgoing).

Written Opinion for International Application No. PCT/US2015/043653, Form PCT/ISA/237 dated Oct. 23, 2015, 13 pages.

Written Opinion of the International Application No. PCT/US2015/010864, Form PCT/ISA/237 dated Apr. 13, 2015, 6 pages.

Eileen—How to Protect Your Dog From Loud and Scary Sounds (Year: 2013).

\* cited by examiner

APPARATUS, SYSTEMS AND METHODS FOR GENERATING VOLTAGE EXCITATION WAVEFORMS

CROSS REFERENCE TO RELATED APPLICATIONS

This application is a continuation application of U.S. application Ser. No. 15/210,498, filed Jul. 14, 2016.

STATEMENT REGARDING FEDERALLY SPONSORED RESEARCH OR DEVELOPMENT

Not applicable.

THE NAMES OF THE PARTIES TO A JOINT RESEARCH AGREEMENT

Not applicable.

BACKGROUND

Apparatus, systems and methods are described herein for providing certain properties in transmit waveforms for use by a companion receiver in determining direction of approach relative to a transmitting source.

DETAILED DESCRIPTION

Figure 1:
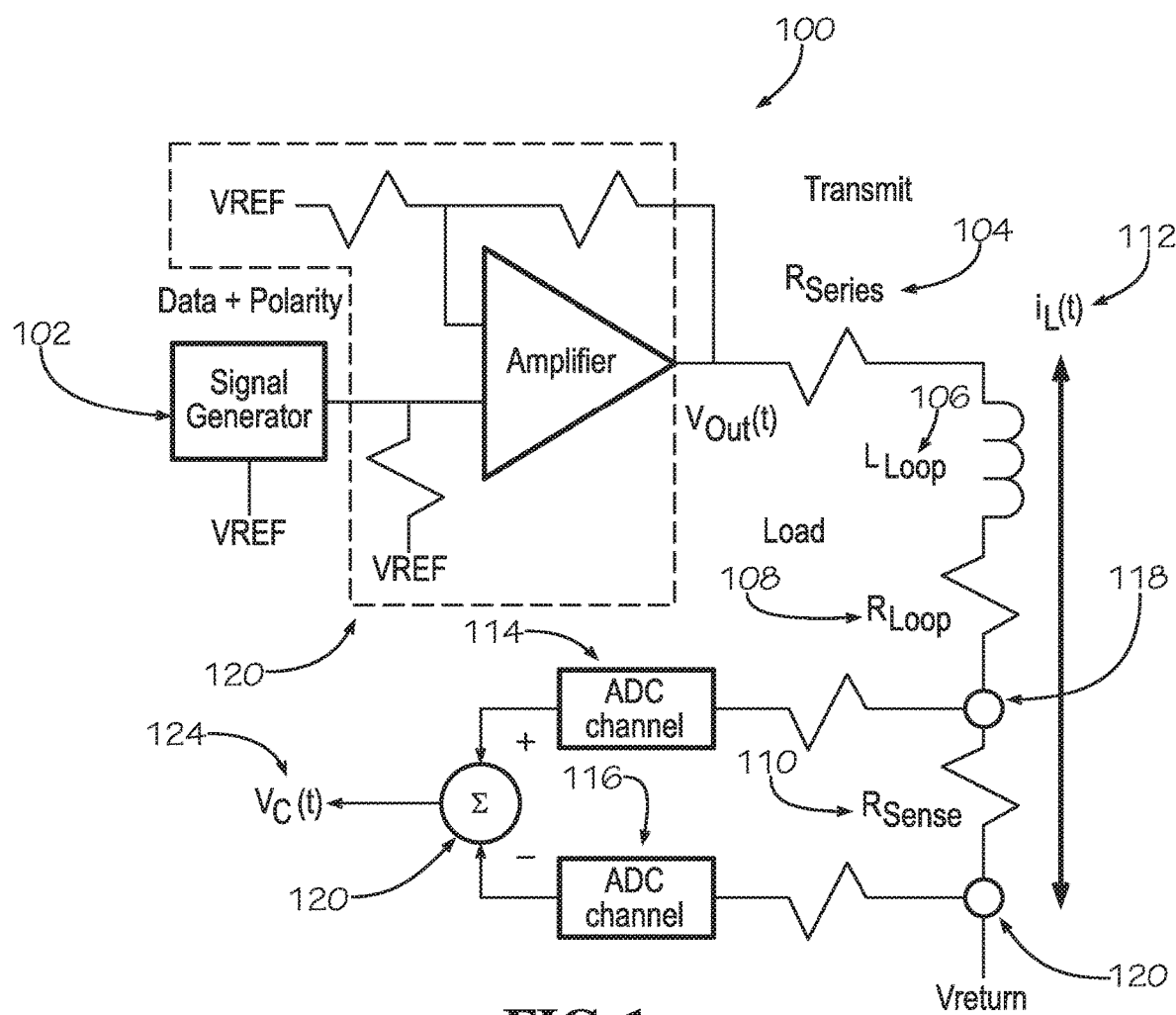
FIG. 1 shows the components of a transmit circuit, under an embodiment.

An electronic animal containment system is described with direction-of-approach determination, or direction-sensitive capabilities. The direction-sensitive animal containment system generally contains a transmitter unit connected to a wire loop bounding a containment area and a receiver unit carried by the animal. The transmit unit provides certain properties in transmit waveforms for use by a companion receiver in determining direction of approach relative to the wire loop bounding the containment area.

Multiple embodiments of an electronic animal containment system provide varying methods for generating the required current in the wire loop. Under one embodiment, a containment signal generator may convert an uneven duty cycle square wave into an asymmetric triangle wave. Under another embodiment, a containment signal generator includes a discrete triangle wave generator allowing the adjustment of the rising and falling slopes. Under this embodiment, the discrete triangle wave generator directly drives the output current drivers and provides two amplitude levels for the triangle waveform.

Under either embodiment, the circuit parameters, $L_{total}$ and $R_{total}$ determine the generating signal required to produce the desired current by the equation:

$$V_{generator}(t) = R_{total} * I_{desired}(t) + L_{total} * \frac{dI_{desired}(t)}{dt} \quad (1)$$

A companion receiver is responsive to:

$$V_{receive}(t) = K_{Rx} * d\beta/dt \quad (2)$$

where
  $d\beta/dt$ is the rate of change of the magnetic flux density;
  $d\beta/dt$ is dependent upon $dI(t)/dt$
  $K_{Rx} = -n*A*u_{c-Rx}$
  n=number of turns in the receive core
  A=area of the receive core (m$^2$)
  $u_{c-Rx}$=geometry dependent relative permeability of the receive core Under one embodiment of an electronic animal containment system, a containment signal generator produces an uneven duty cycle square wave. A long wire load (or perimeter boundary wire) connected to the transmitter may result in an asymmetric triangle current flowing through the wire. This is true when the load is predominantly inductive under an embodiment, hence:

$$V_{generator}(t) = L_{total} * \frac{dI_{desired}(t)}{dt} \quad (3)$$

$$\frac{dI_{desired}(t)}{dt} = V_{generator}(t)/L_{total} \quad (4)$$

Under this specific condition, an uneven duty cycle square wave will produce the desired asymmetry in the wire current.

Under another embodiment, a containment signal generator includes a discrete triangle wave generator allowing the adjustment of the rising and falling slopes. The discrete triangle wave generator directly drives the output current drivers and provides two amplitude levels for the triangle waveform. However, the desired asymmetry is produced only when the load is predominantly resistive under an embodiment, hence:

$$V_{generator}(t) = R_{total} * I_{desired}(t) \quad (5)$$

$$I_{desired}(t) = V_{generator}(t)/R_{total} \quad (6)$$

Under this specific condition a discrete triangle wave generator with adjustable rising and falling slopes produce the desired asymmetry.

Magnetic Field Relationships Between the Transmitter and Receiver

System Model

FIG. 1 shows the components of a transmit circuit 100. FIG. 1 shows a signal generator 102 connected to an amplifier 120. The amplifier is connected to transmit components comprising resistor $R_{series}$ 104, which is in series with inductor $L_{Loop}$ 106, which is in series with resistor $R_{Loop}$ 108, which is in series with resistor $R_{sense}$ 110. The transmit components are indicated in bold as shown in FIG. 1. Current $I_L$ (t) 112 flows through the transmit components. The amplifier 120 may be any amplifier topology with sufficient power output capability to produce $V_{out}(t)$ and $I_L$ (t) for the given load. Note that $V_{out}(t)$ is given by the following equation:

$$V_{out}(t) = (R_{series} + R_{Loop} + R_{sense}) * I_L(t) + L_{Loop} * dI_L(t)/dt. \quad (7)$$

FIG. 1 also shows analog-to-digital convertors 114 and 116 respectively connected to the transmit loop at points 118 and 120. An analog-to-digital converter (ADC) is a device that converts a continuous physical quantity (in this case, $I_L(t)$ produces a voltage across $R_{sense}$) to a digital number that represents the quantity's amplitude. The conversion involves quantization of the input, so it necessarily introduces a small amount of error. Furthermore, instead of continuously performing the conversion, an ADC does the conversion periodically, sampling the input. The result is a sequence of digital values that have been converted from a continuous-time and continuous-amplitude analog signal to a discrete-time and discrete-amplitude digital signal. The summation component 120 of the transmit circuit combines the voltage amplitude at point 118 and point 120 to approximate the voltage drop across $R_{sense}$, i.e. $V_C(t)$ 124.

Figure 2:
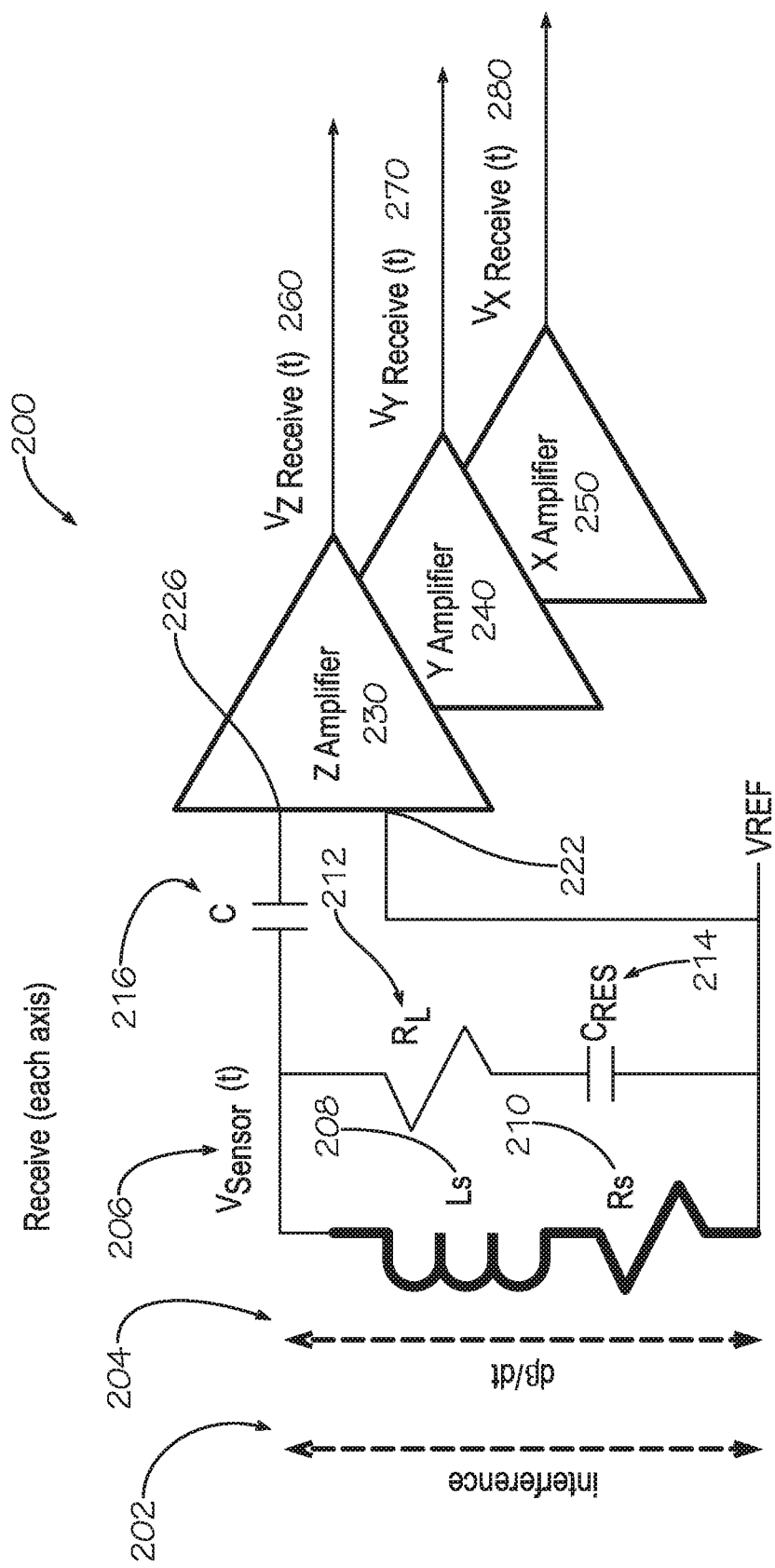
FIG. 2 shows the components of a receive circuit, under an embodiment.

FIG. 2 shows the components of a receive circuit 200. FIG. 2 shows interference 202 and time varying magnetic flux density, $$\frac{d\beta}{dt},$$

204 presented to the receive components. $V_{sensor}(t)$ 206 is the voltage rendered by the receive R-L-C circuit. The receive components include inductor $L_s$ 208 and resistor $R_s$ 210 in series. The receive components are in parallel with resistor $R_L$ 212 and capacitor $C_{RES}$ 214 which are in series with each other. The parallel circuit components are also in series with capacitor C 216. Points 220 and 222 represent respective inputs for Z Amplifier 230, Y Amplifier 240, and X Amplifier 250. $VZ_{Receive}(t)$ 260 represents the output voltage of the Z Amplifier. $VY_{Receive}(t)$ 270 represents the output voltage of the Y Amplifier. $VX_{Receive}(t)$ 280 represents the output voltage of the X Amplifier. Typically, the inductors, Ls, associated with each amplifier circuit (X, Y, and Z) are oriented orthogonal to one another. Note that for the sake of simplicity, the systems and methods described below refer to a single amplifier of a receiver. $V_{Rx\_sensor}(t)$ indicates the amplifier input voltage under an embodiment. $V_{Receive}(t)$ represents amplifier output voltage.

Magnetic Field Relationships

Figure 3:
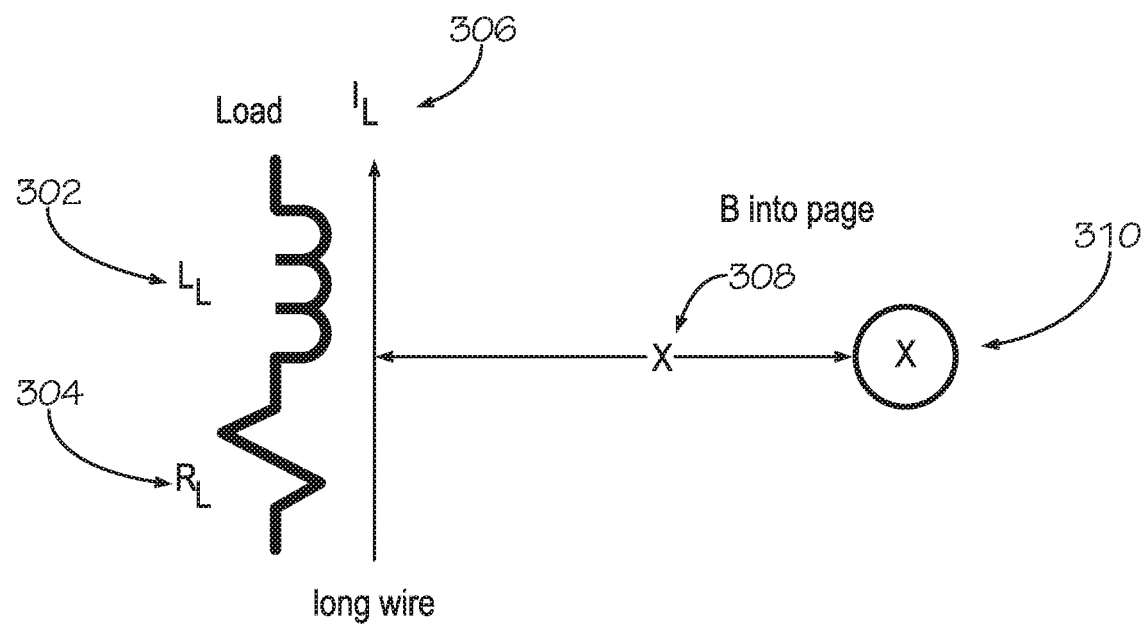
FIG. 3 shows time varying magnetic flux density generated by a current in a long wire, under an embodiment.

FIG. 3 shows the time varying magnetic flux density generated by a current in a long wire. FIG. 3 shows an inductor $L_L$ 302 in series with a resistor $R_L$ 304 which reflect the circuit model for a long wire under an embodiment. FIG. 3 shows current $I_L$ 306. The point x 308 represents the distance to the wire in meters. The point X 310 shows the magnetic flux density travelling into the page. The time varying magnetic flux density is governed by the following equations:

$$u_0 = 4\pi * 10^{-7} \left(\frac{\text{Henry}}{\text{meter}}\right)$$

$I(t)$ = loop current (amps)

$x$ = distance to point (meters)

$$\beta(t) = I_L(t) \left(\frac{u_0}{2\pi x}\right)$$

The time varying flux density at point x is specifically given by $$d\beta/dt = dI_L(t)/dt * (u_0/2\pi x) \quad (8)$$

Figure 4:
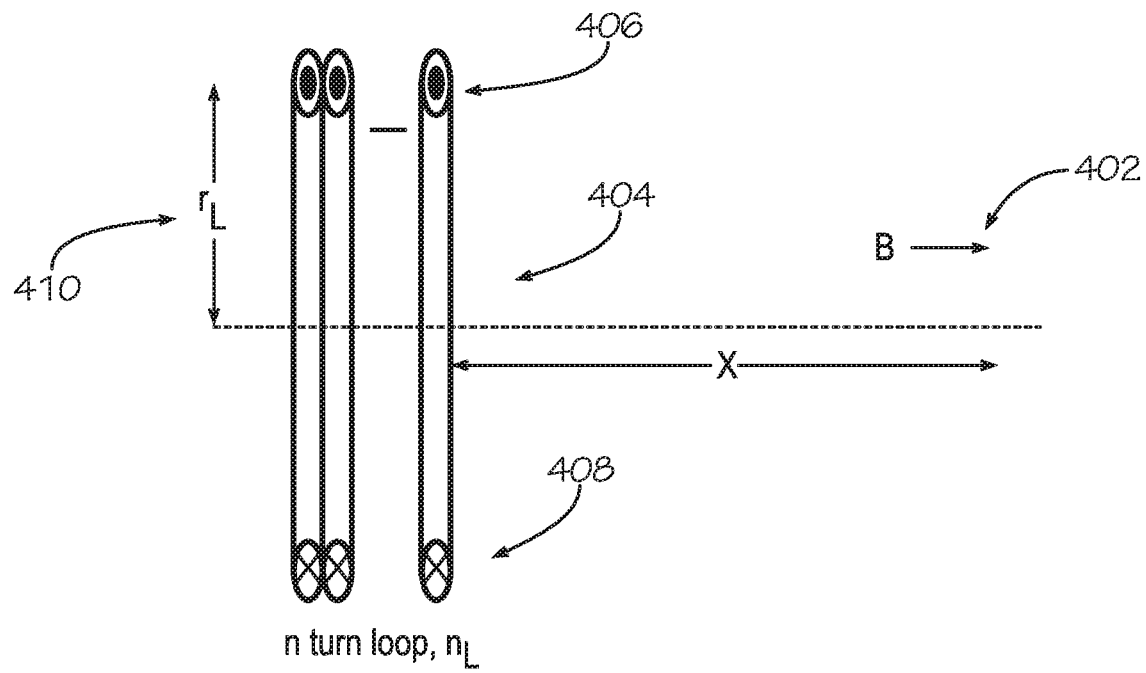
FIG. 4 shows time varying magnetic flux density generated by a current in a multi-turn air core loop, under an embodiment.

FIG. 4 shows time varying magnetic flux density generated by a current in a multi-turn air core loop. FIG. 4 shows the direction of the time varying magnetic flux density 402. The multi-turn air core loop 404 comprises n turns, $n_L$. Current $I_L$ enters the page at points 408 and exits the page at points 406. The coil 404, i.e. each loop turn, comprises a radius $r_L$ 410. The time varying magnetic flux density at a point x along the coil axis shown is governed by the following equations:

$$\beta = I(t) * n_L * u_0 * r_L^2 \Big/ \left(2(r_L^2 + x^2)^{\frac{3}{2}}\right)$$

$$d\beta/dt = dI(t)/dt * n_L * u_0 * r_L^2 \Big/ \left(2(r_L^2 + x^2)^{\frac{3}{2}}\right)$$

-continued $I_L(t)$ = loop current (amps)

$$u_0 = 4\pi * 10^{-7} \left(\frac{\text{Henry}}{\text{meter}}\right)$$

$n_L$ = number of turns

The time varying flux density at point x along the coil axis is specifically given by $$d\beta/dt = dI(t)/dt * n_L * u_0 * r_L^2/(2(r_L^2+x^2)^{3/2}) \quad (9)$$

Figure 5:
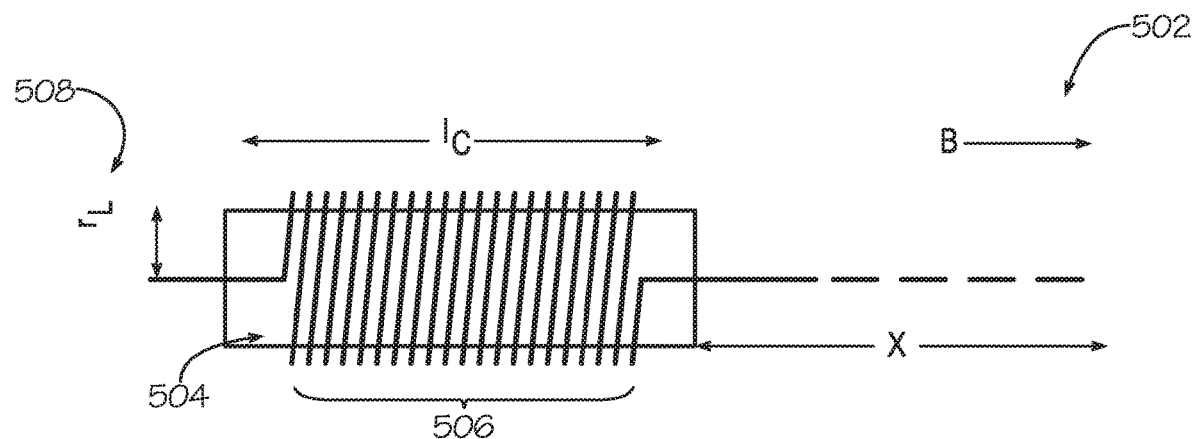
FIG. 5 shows time varying magnetic flux density generated by a current in a multi-turn ferrite core loop, under an embodiment.

FIG. 5 shows time varying magnetic flux density 502 generated by a current in a multi-turn ferrite core loop 504. The ferrite core loop comprises n turns, $n_L$ 506. The coil 504, i.e. each loop turn, comprises a radius $r_L$ 508. FIG. 5 shows the direction of the time varying magnetic flux density 502 and direction of current $I_C$ 510. The time varying magnetic flux density at a point x along the coil axis is governed by the following equations:

$$\beta = I(t) * u_{c-Tx} * n_L * u_0 * r_L^2 \bigg/ \left(2(r_L^2 + x^2)^{\frac{3}{2}}\right)$$

$$d\beta/dt = dI(t)/dt * u_{c-Tx} * n_L * u_0 * r_L^2 \bigg/ \left(2(r_L^2 + x^2)^{\frac{3}{2}}\right)$$

$I_L(t)$ = loop current (amps)

$$u_0 = 4\pi * 10^{-7} \left(\frac{\text{Henry}}{\text{meter}}\right)$$

$u_{c-Tx}$ = 10 to 100 (typical relative permeability
     of the ferrite transmitter core geometry and material)

$n_L$ = number of turns

The time varying flux density at point x along the coil axis is specifically given by $$d\beta/dt = dI_L(t)/dt * u_{c-Tx} * n_L * u_0 r_L^2/(2(r_L^2+x^2)^{3/2}) \quad (10)$$

Receiver Output Voltage

Figure 6:
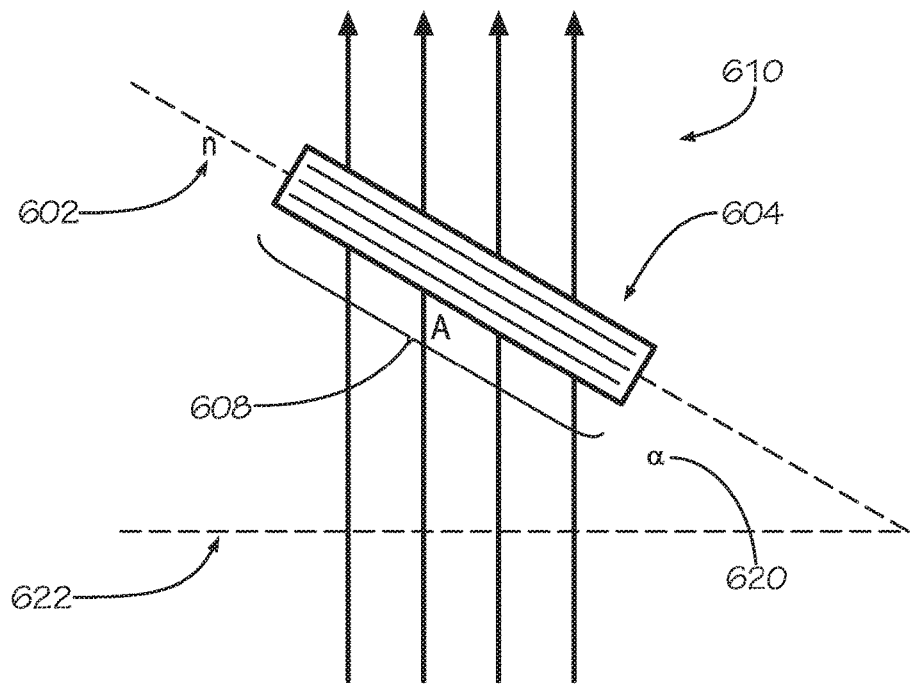
FIG. 6 shows a loop antenna, under an embodiment.

Receive sensor output voltage results from proximity to a time varying magnetic flux density. FIG. 6 show an "n" turn 602 loop antenna 604 with area "A" 608. Note that the area A represents the area of one loop antenna turn. The upwardly directed arrows represent time varying magnetic flux density 610. The parameter α 620 represents the angle between horizontal line 622 and the loop antenna. The receive sensor output voltage is given by $$V_{out} = -nx\frac{d\phi}{dt} = -n * A(\text{dot}) d\beta/dt$$

for air core: $\frac{d\beta_{air}}{dt} = \frac{u_0 dH}{dt}$ for ferrite core: $\frac{d\beta_{FC}}{dt} = u_0 * u_{c-Rx}\left(\frac{dH}{dt}\right) = u_{c-Rx} * d\beta_{air}/dt$ $u_{c-Rx} = u_r/(1 + N(u_r - 1))$ Note that N is a geometry dependent demagnetizing factor, and $u_r$ is the relative permeability of the receive core. A small N results in $u_{c-Rx}$ that approaches $u_r$.

This particular receiver sensor output voltage, $V_{Rx\ Sensor}$(t) is given by:

$$V_{Rx\ Sensor}(t) = (-n * A * u_{c-Rx}) * \frac{d\beta}{dt} \quad (11)$$

$$V_{Rx\ Sensor}(t) = K_{Rx} * d\beta/dt \quad (12)$$

where,
$K_{Rx} = -n * A * u_{(C-Rx)}$ (constant receive terms)
$n$ = number of turns in the receive core
$A$ = area of the receive core (m²)
$u_{C-Rx}$ = geometry dependent relative permeability of the receive core As shown above, the sensor output is proportional to dβ(t)/dt. However, dβ(t)/dt is dependent on the source of the time varying magnetic field (i.e. long wire, air coil, ferrite coil, etc.)

For a long wire:

$$d\beta/dt = dI_L(t)/dt * (u_0/2\pi x) \quad (13)$$

$$d\beta/dt = dI_L(t)/dt * K_{Tx-long\ wire} \quad (14)$$

where, $$u_0 = 4\pi * 10^{-7} \left(\frac{\text{Henry}}{\text{meter}}\right)$$

$x$ = distance to wire or loop (m)
$K_{Tx-long\ wire} = u_0/2\pi x$

For multi-turn air core loop:

$$d\beta/dt = dI(t)/dt * n_L * u_0 r_L^2/(r_L^2+x^2)^{3/2} \quad (15)$$

$$d\beta/dt = dI(t)/dt * (K_{Tx-coil\ air}) \quad (16)$$

where,
$n_L$ = number of turns
$r_L$ = radius of the mult-turn transmit coil loop
$K_{Tx-coil\ air} = n_L * u_0 * r_L^2/(2(r_L^2+x^2)^{3/2})$ For a multi-turn ferrite core loop:

$$d\beta/dt = dI_L(t)/dt * u_{c-Tx} * n_L * u_0 * r_L^2/(2(r_L^2+x^2)^{3/2}) \quad (17)$$

$$d\beta/dt = dI_L(t)/dt * K_{Tx-coil\ ferrite} \quad (18)$$

where $u_{C-Tx}$ = geometry dependent relative permeability of the transmit core $$K_{Tx-coil\ ferrite} = u_{c-Tx} * n_L * u_0 * r_L^2/(2(r_L^2+x^2)^{3/2}) \quad (20)$$

The receive sensor plus amplifier output voltage, $V_{Receive}$(t), can be generalized as $$\begin{aligned}V_{Receive}(t) &= \text{Gain}_{amp}(F_C) * V_{Rx\ Sensor}(t) = \\ &\text{Gain}_{amp}(F_C) * K_{Rx} * d\beta/dt\end{aligned} \quad (21)$$

$$V_{Receive}(t) = \text{Gain}_{amp}(F_C) * dI_L(t)/dt * K_{Rx} * (K_{Tx(\#)}) \quad (22)$$

where,
$\text{Gain}_{amp}(F_C)$ = the amplifier gain at the frequency of interest
$K_{Rx} = -n * A * u_{C-Rx}$ (constant receive terms)
$n$ = number of turns in the receive core
$A$ = area of the receive core (m²)
$u_{C-Rx}$ = geometry dependent relative permeability of the receive core
$K_{Tx(\#)}$ is dependent on the source of the time varying magnetic field Therefore, an observable asymmetric property in $dI_L(t)/dt$, is preserved in $V_{Receive}(t)$. The asymmetry may be exploited by the companion receiver to indicate the direction of approach.

The desired transmit current contains an asymmetry in $dI_L(t)/dt$ that permits a receiver to determine direction of approach. The $dI_L(t)/dt$ asymmetry is observed as a difference between the positive and negative time duration and/or a difference in the positive and negative peak values at the output of the receiver sensor and amplifier chain.

Figure 7A:
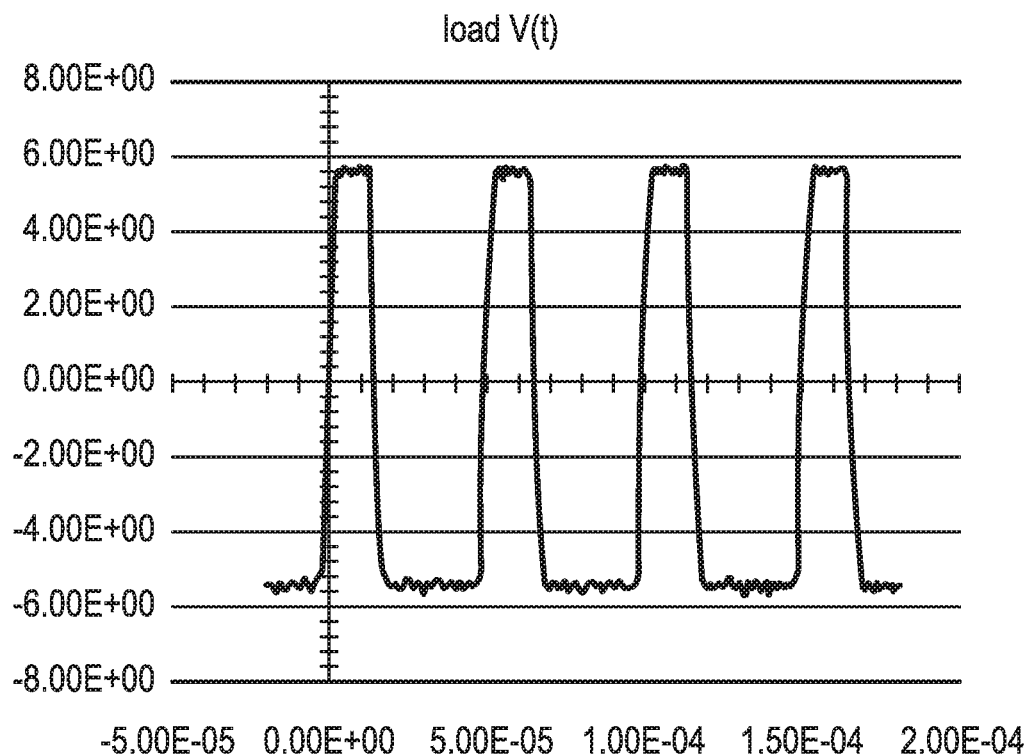
FIGS. 7A-7C demonstrates excitation characteristics for a dominantly inductive wire load, under an embodiment.
Figure 7B:
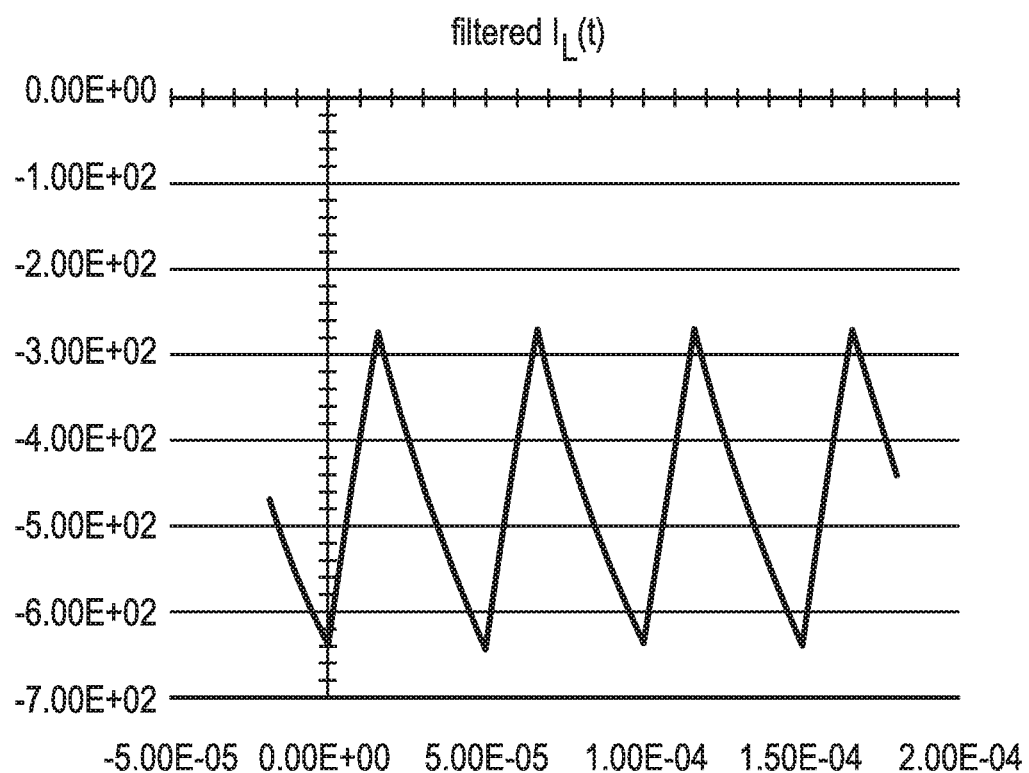
Figure 7C:
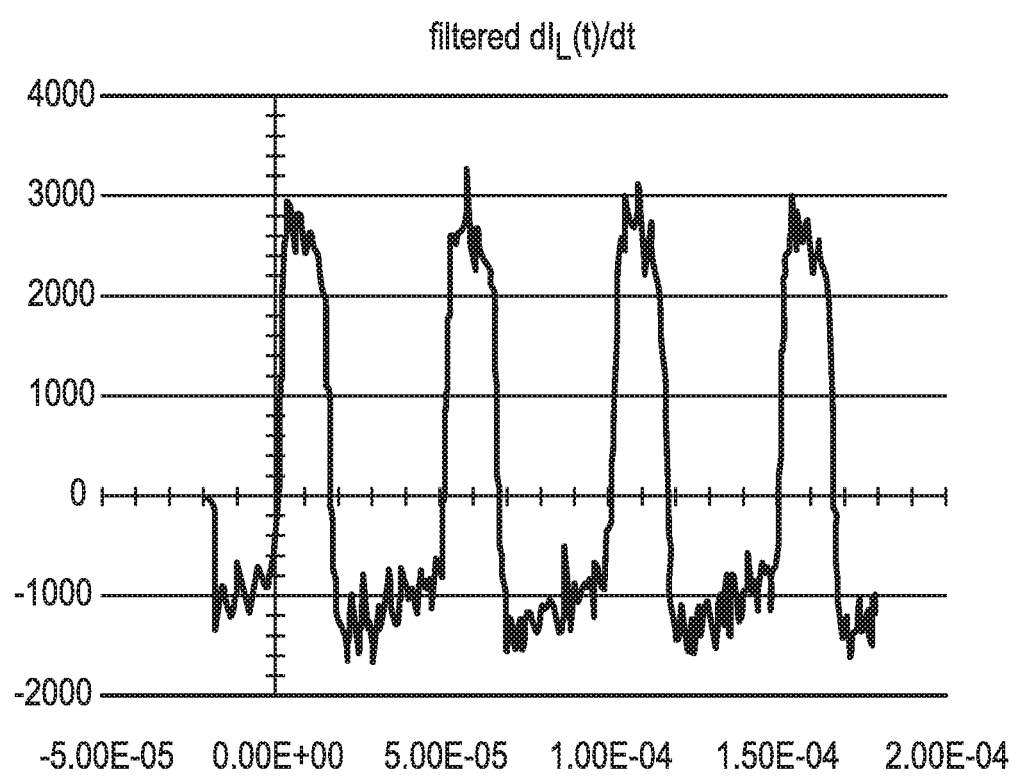
Figure 8A:
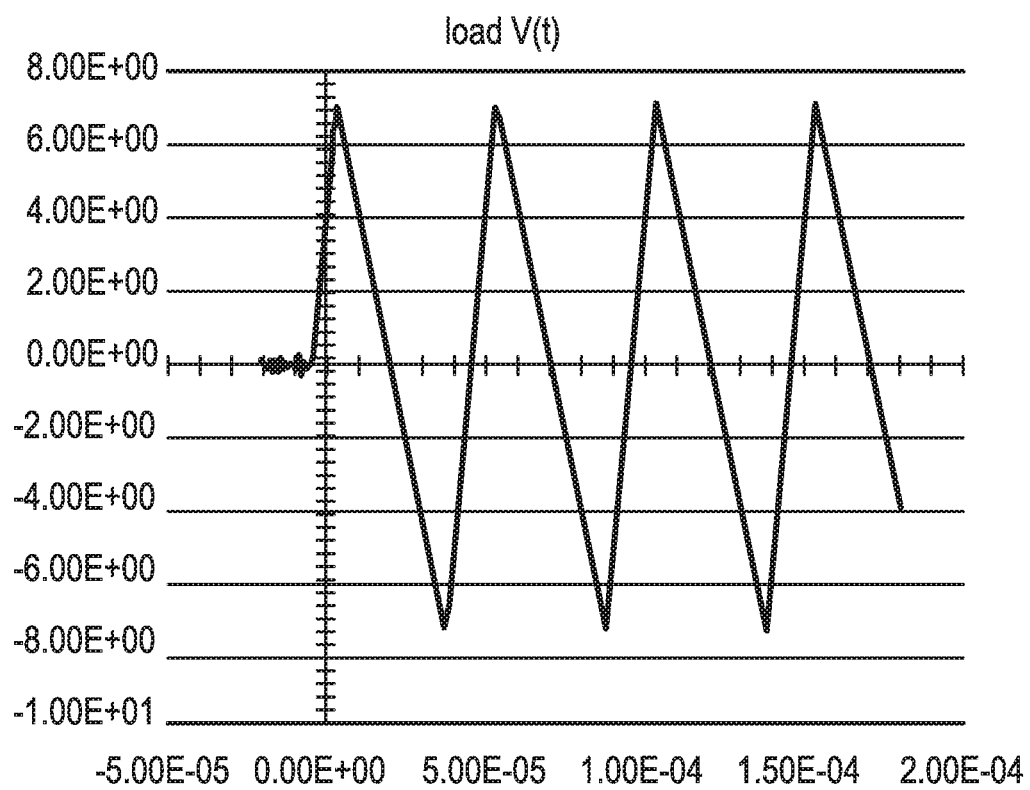
FIGS. 8A-8C demonstrates excitation characteristics for a dominantly inductive wire load, under an embodiment.
Figure 8B:
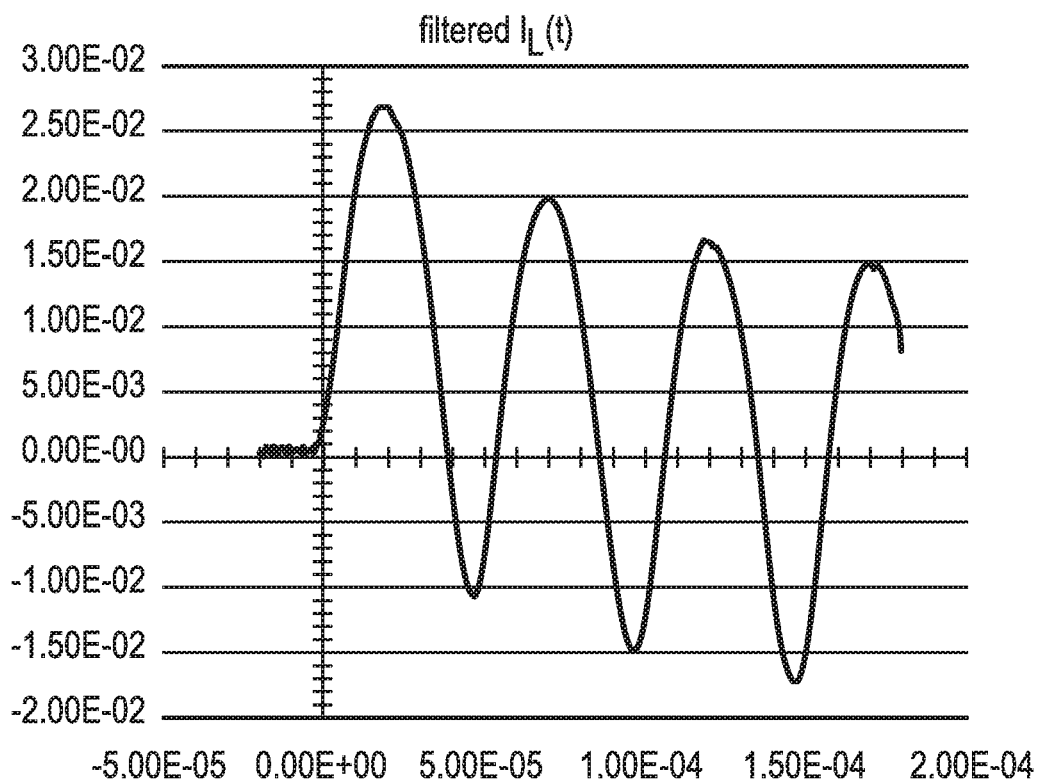
Figure 8C:
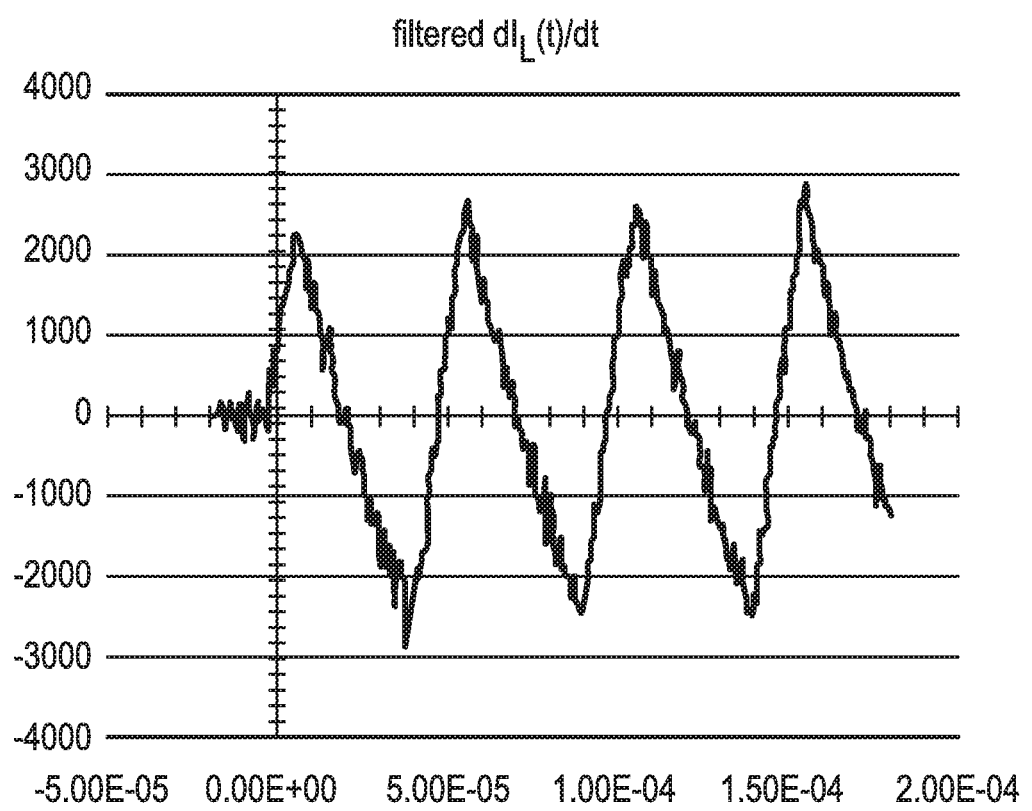

FIG. 7 and FIG. 8 demonstrate excitation characteristics for a dominantly inductive wire load. FIGS. 7A-7C show an example of square wave excitation under an embodiment. FIG. 7A shows load voltage V(t) of a transmitter as a function of time (seconds). FIG. 7B displays the corresponding load current. In particular, FIG. 7B shows the filtered load current $I_L$ as a function of time (seconds). FIG. 7C shows the filtered rate of change in load current $dI_L(t)/dt$ as a function of time (seconds). FIGS. 8A-8C shows an example of triangle wave excitation under an embodiment. FIG. 8A shows the load voltage V(t) of a transmitter as a function of time (seconds). FIG. 8B displays the corresponding load current. In particular, FIG. 8B shows the filtered load current $I_L$ as a function of time (seconds). FIG. 8C shows the filtered rate of change in load current $dI_L(t)/dt$ as a function of time (seconds). Note from FIG. 7 and FIG. 8 that for dominantly inductive long wire loads, the desired asymmetry in $dI_L(t)/dt$ occurs for square wave excitation.

Figure 9A:
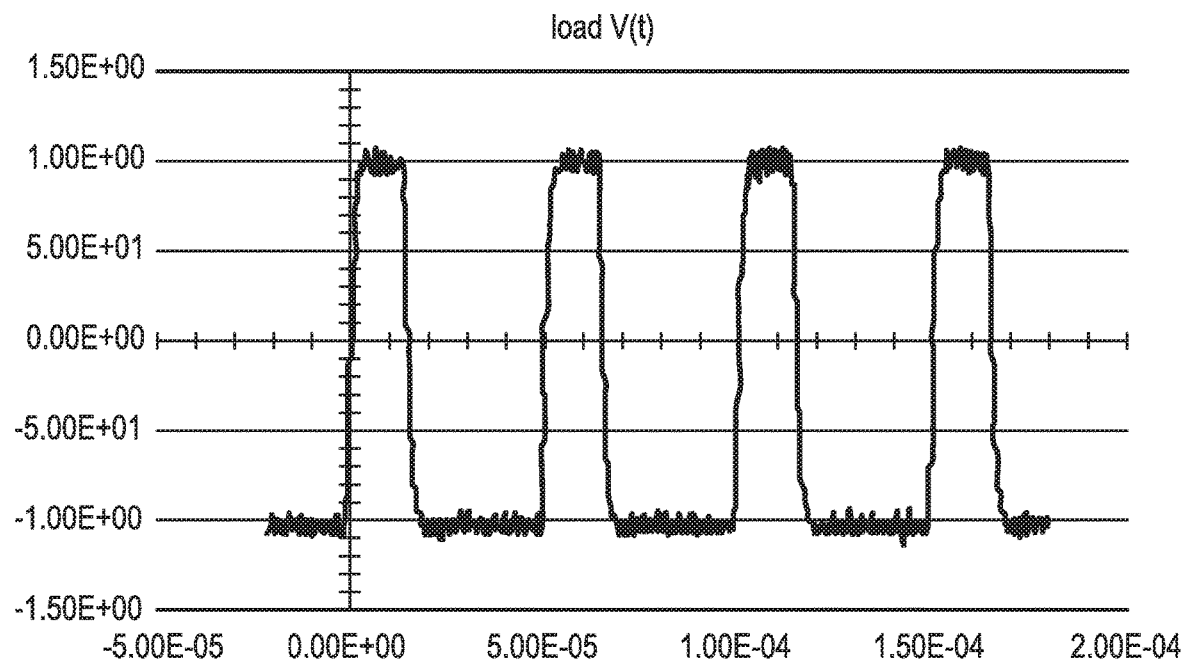
FIGS. 9A-9C demonstrate excitation characteristics for a for a dominantly resistive long wire load, under an embodiment.
Figure 9B:
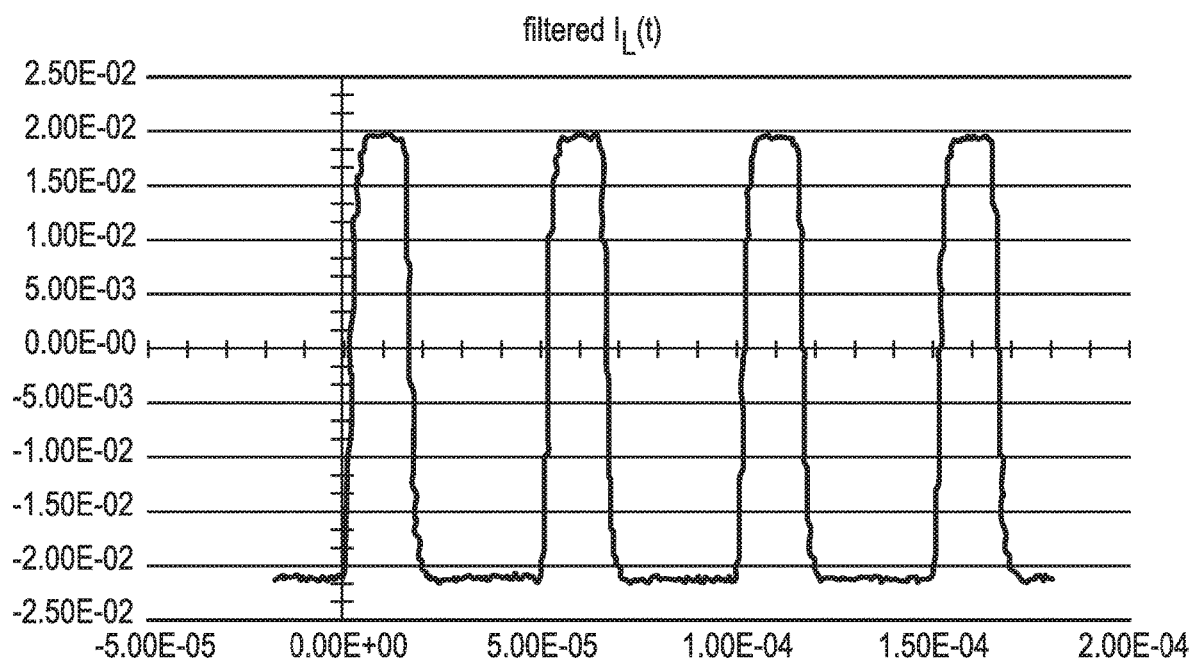
Figure 9C:
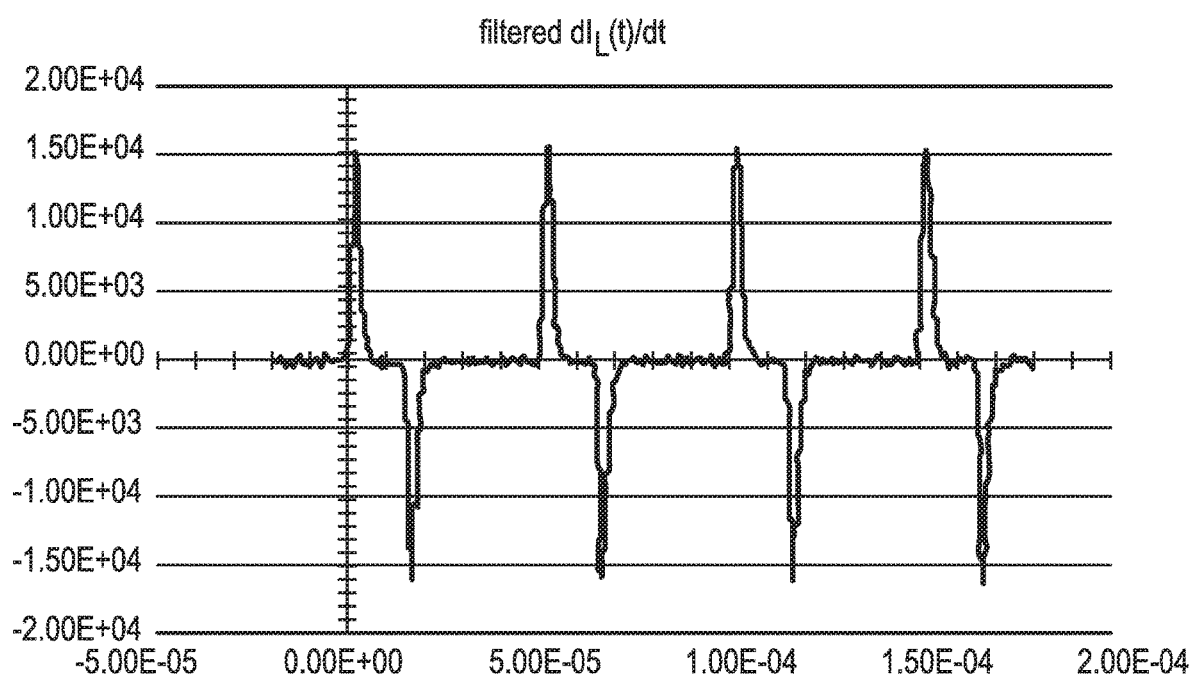
Figure 10A:
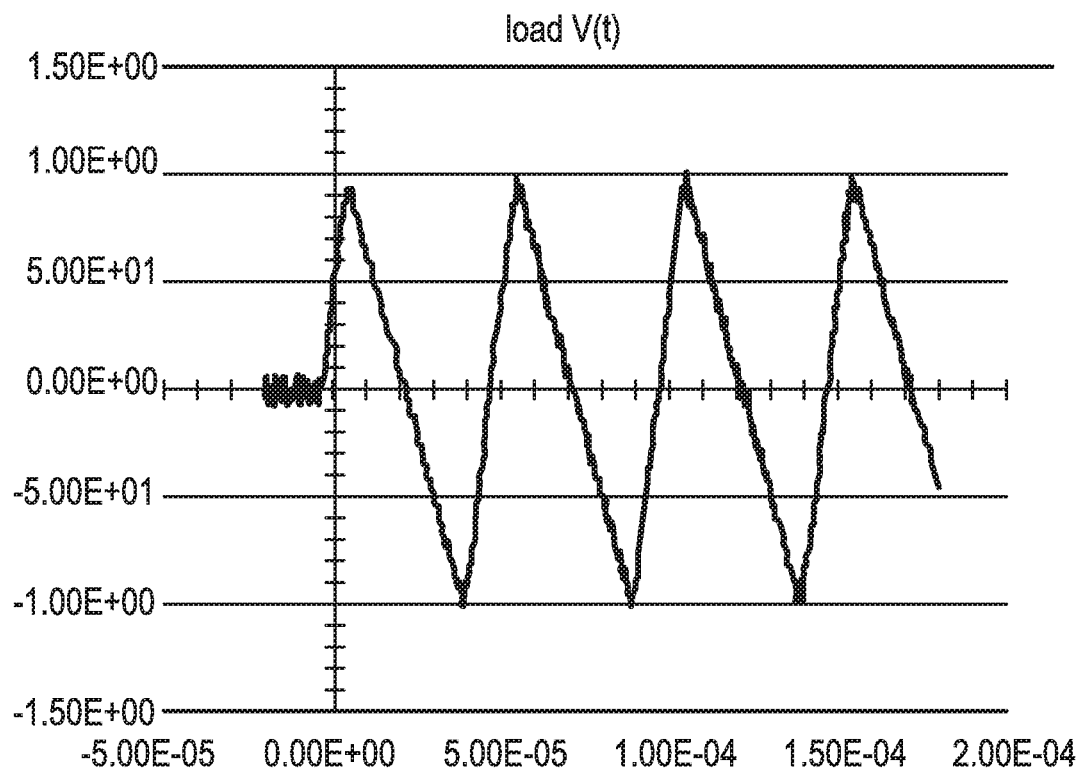
FIGS. 10A-10C demonstrate excitation characteristics for a for a dominantly resistive long wire load, under an embodiment.
Figure 10B:
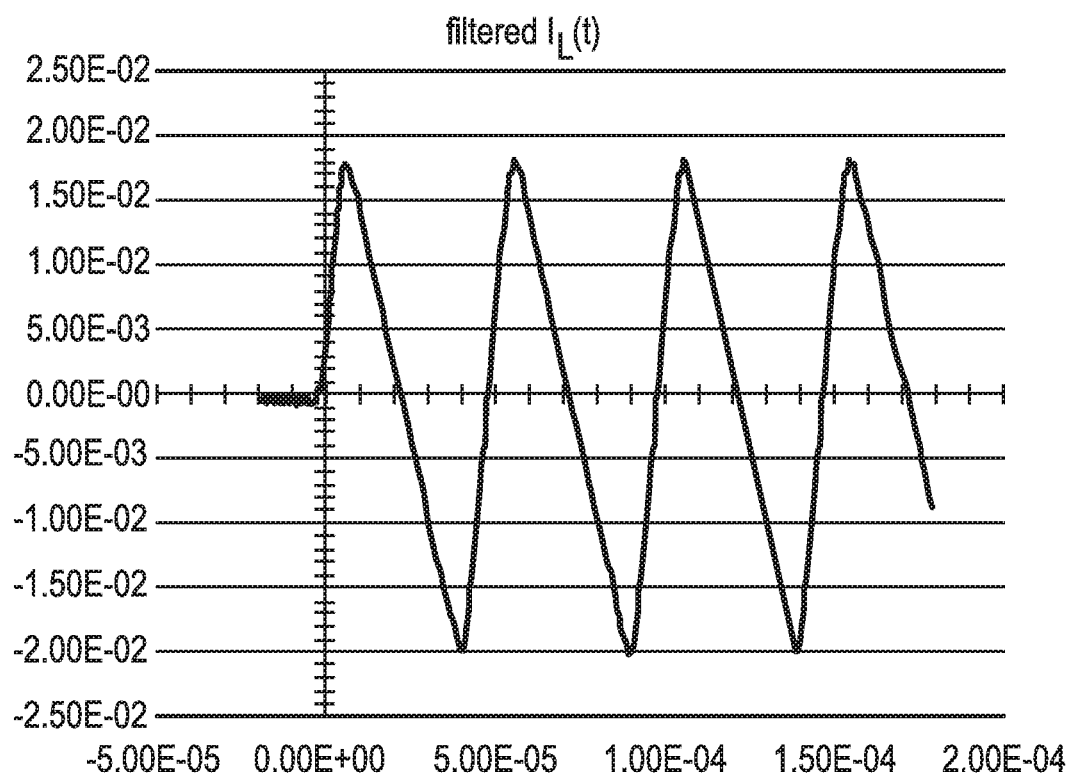
Figure 10C:
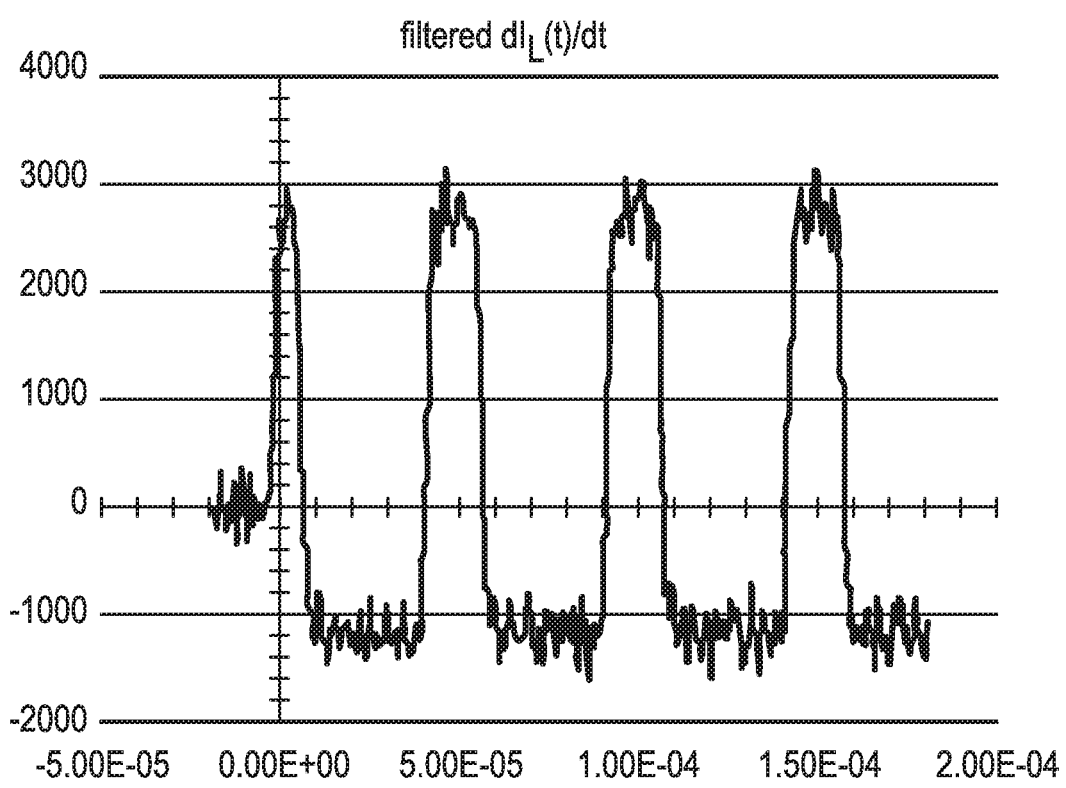

FIG. 9 and FIG. 10 demonstrate excitation characteristics for a dominantly resistive long wire load. FIGS. 9A-9C show an example of square wave excitation under an embodiment. FIG. 9A shows load voltage V(t) of a transmitter as a function of time (seconds). FIG. 9B displays the corresponding load current. In particular, FIG. 9B shows the filtered load current $I_L$ as a function of time (seconds). FIG. 9C shows the filtered rate of change in load current $dI_L(t)/dt$ as a function of time (seconds). FIGS. 10A-10C show an example of triangle wave excitation under an embodiment. FIG. 10A shows the load voltage V(t) of a transmitter as a function of time (seconds). FIG. 10B displays the corresponding load current. In particular, FIG. 10B shows the filtered load current $I_L$ as a function of time (seconds). FIG. 10C shows the filtered rate of change in load current $dI_L(t)/dt$ as a function of time (seconds). Note from FIG. 9 and FIG. 10 that for dominantly resistive long wire loads, the desired asymmetry in $dI_L(t)/dt$ occurs for asymmetric triangle wave excitation.

System, Method, and Apparatus for Constructing Voltage Excitation Waveform

Discrete Time Function

Figure 11:
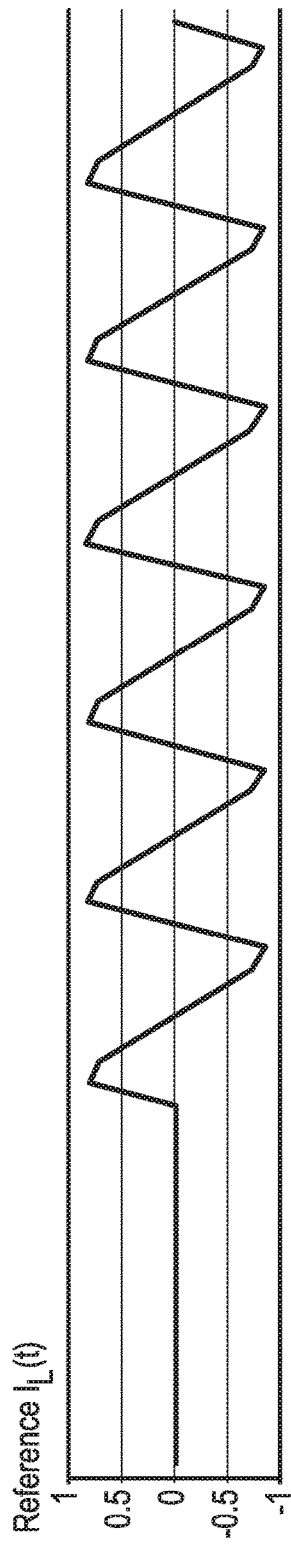
FIG. 11 shows reference current $I_L(t)$ resulting from the discrete time function $I_L(n\Delta t)$, under an embodiment.

Under one embodiment, a discrete time function, $I_L(n\Delta t)$ is created which describes the desired load current asymmetry. Under an embodiment, the desired asymmetry is a triangle current waveform with different positive and negative slopes. FIG. 11 shows reference current $I_L(t)$ resulting from the discrete time function $I_L(n\Delta t)$ as further described below.

OOK (On Off Keying) or amplitude modulation (amplitude shift keying) is used to modulate (or impart data onto) the discrete time function $I_L(n\Delta t)$ as further described below. The modulation function is referred to as modulation($n\Delta t$) and resolves to either one or zero under an embodiment.

Rotating phasor values, expressed as $\Phi(n\Delta t)=\omega n\Delta t$ (modulo $2\pi$), are used to generate the discrete time function $I_L(n\Delta t)$ as further described below.

The discrete time function $I_L(n\Delta t)$ comprises a desired asymmetry of 30%. Symmetry test thresholds for $\Phi(n\Delta t)$ are as follows:

$s_1$=0.942478 radians
$s_2$=5.340708 radians

Using these test thresholds, the region of positive slope comprises 30% of $2\pi$ radians.

Figure 12:
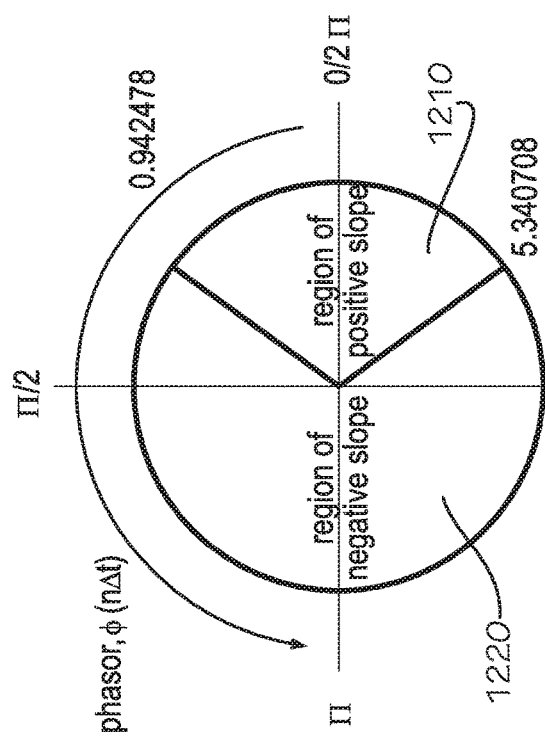
FIG. 12 shows phasor $\Phi(n\Delta t)$ rotating about a unit circle, under an embodiment.

FIG. 12 shows phasor $\Phi(n\Delta t)$ rotating about a unit circle with a frequency, f. Note that angular frequency $\omega$ (rads/sec)=$2\pi f$. FIG. 12 shows symmetry test threshold $s_1$=0.942478 and $s_2$=5.340708. FIG. 12 displays a region of positive slope 1210 and a region of negative slope 1220 that result in the desired asymmetry.

The desired positive slope $m_1$ of $I_L(n\Delta t)$ comprises change in amplitude/change in $\Phi(n\Delta t)$. The desired positive slope of $I_L(n\Delta t)$ is $m_1=2/(2*s_1)$. The desired negative slope $m_2$ of $I_L(n\Delta t)$ comprises change in amplitude/change in $\Phi(n\Delta t)$. The desired negative slope of $I_L(n\Delta t)$ is $m_2=-2/(2\pi-2*s_1)$.

The discrete time function, $I_L(n\Delta t)$ is given by the following logic:

(23)
```
if (modulation(nΔt) != 0)
    if (Φ(nΔt) >= s₂ OR Φ(nΔt) < s₁),  // region of positive slope
        if (Φ(nΔt) < s₁), ΔΦ = Φ(nΔt) + s₁
        else              ΔΦ = Φ(nΔt) - s₂
        I_L(nΔt) = (modulation(nΔt) * ΔΦ * m₁ ) - 1
    else // region of negative slope,
        ΔΦ = Φ(nΔt) - s₁
        I_L(nΔt) = (modulation(nΔt) * ΔΦ * m₂ ) + 1
else I_L(nΔt) = 0       // no modulation
```

Figure 13:
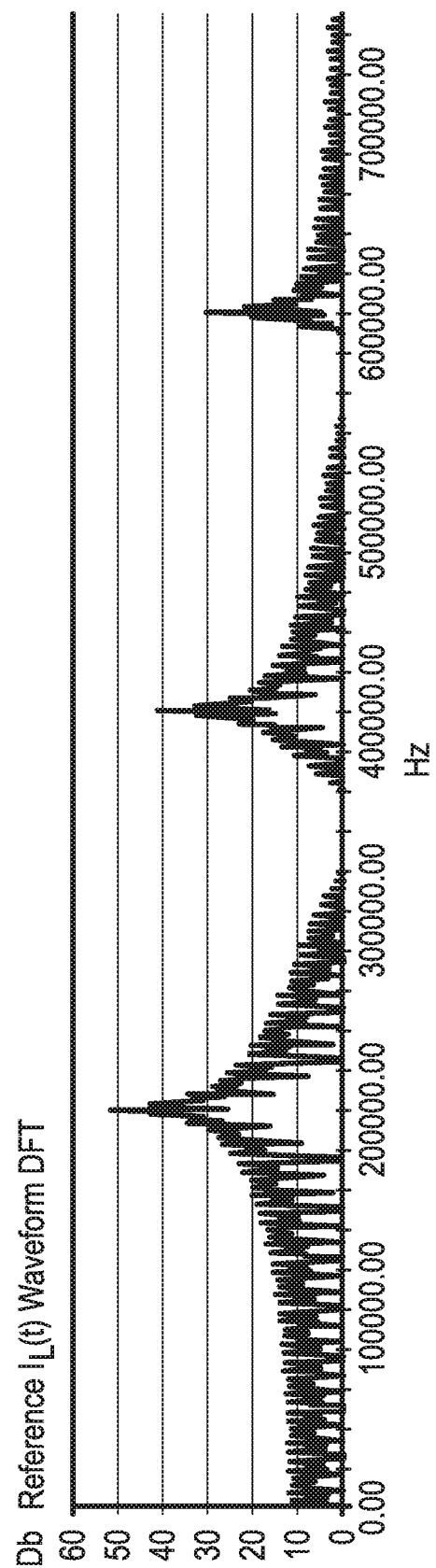
FIG. 13 shows the frequency content of a desired current provided by a discrete time function, under an embodiment.

FIG. 13 shows the frequency content of the desired current provided by the discrete time function, $I_L(n\Delta t)$, when f=20,000 Hz. FIG. 13 provides the results of Discrete Fourier Transform analysis. The figure shows a first harmonic at a frequency of 20,000 Hz and with relative amplitude 53 db. The figure shows a second harmonic at a frequency of 40,000 Hz and with relative amplitude of 43 db. The figure shows a third harmonic at a frequency of 60,000 Hz and with relative amplitude of 30 db. The relative harmonic relationships of the desired $I_L(n\Delta t)$ are:

| Harmonic: | Relative Amplitude: | Relative Phase (rads): |
|---|---|---|
| 1st | 1 | 0 |
| 2nd | 0.3060 | 0 |
| 3rd | 0.0819 | 0 |

Practical limitations of the DFT algorithm permit showing only the first three harmonics. In practice, the harmonics continue indefinitely.

Approximate Current Using First and Second Harmonics

Figure 14:
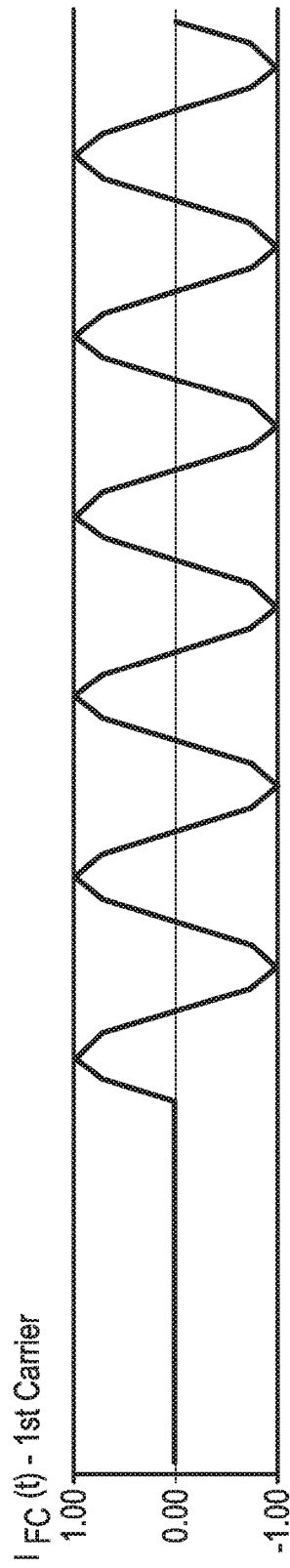
FIG. 14 shows a first carrier component of a desired current, under an embodiment.
Figure 15:
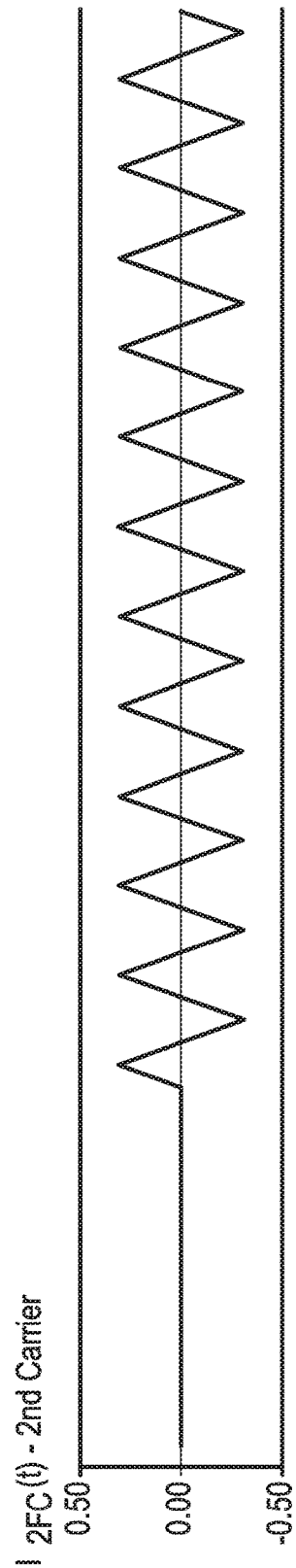
FIG. 15 shows a second carrier component of a desired current, under an embodiment.
Figure 16:
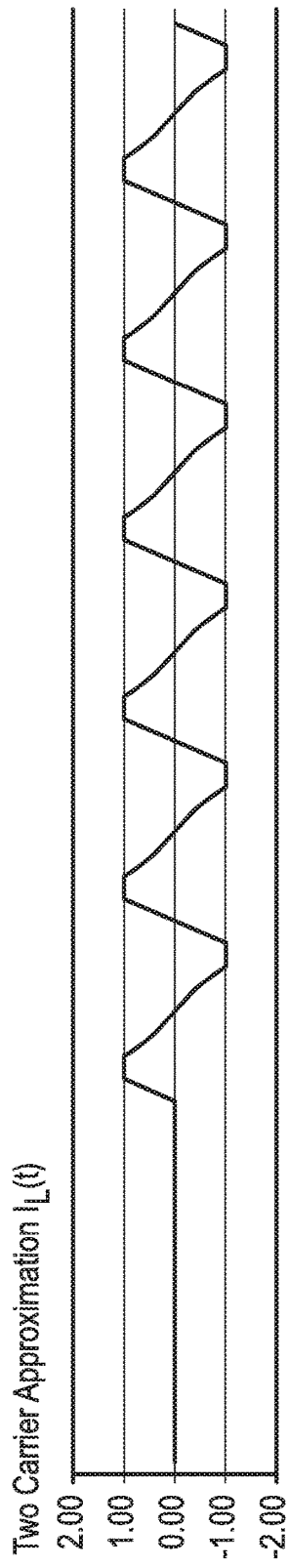
FIG. 16 shows a two carrier approximation of a desired current, under an embodiment.

The desired current may then be approximated using only the first and second harmonics. FIG. 14 shows a first carrier $I_{FC}(n\Delta t)$ component of the desired current using the first relative amplitude of the first harmonic. FIG. 15 shows a second carrier $I_{2FC}(n\Delta t)$ component of the desired current using the relative amplitude of the second harmonic. Again note that the relative amplitude of the first and second harmonics are 1.00 and 0.3060 respectively. Therefore, a two carrier approximation to $I_L(n\Delta t)$ (shown in FIG. 16) is given by $$AI_L(n\Delta t)=\sin(\omega n\Delta t)+0.3060*\sin(2\omega n\Delta t) \quad (24)$$

where,
f=20,000 Hz
$\omega=2\pi f$

The sample rate, $1/\Delta t$, is left to the discretion of the system designer but should be high enough (i.e. =>8× the fundamental frequency) to achieve the desired precision.

The sampling rate used in this example is 160,000 Hz, i.e. 8*f. With only two terms, the operations required to realize the approximation are easy to perform in a low cost commercial microprocessor using either batch or real time processing algorithms.

Iterative, Adaptive, Feedback Control Algorithm

Derive an Estimate of the Loop Inductance ($L_{Loop}$) and Loop Resistance ($R_{Loop}$)

Figure 17:
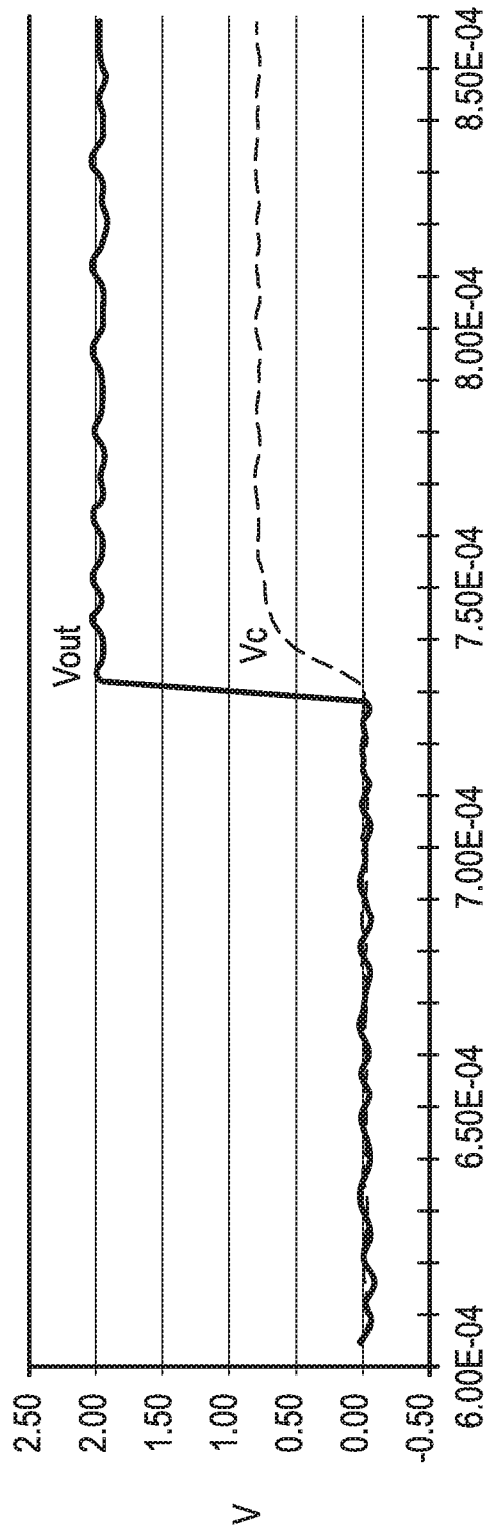
FIG. 17 shows voltage amplitudes $V_{out}$ and $V_C$ as a function of time (seconds), under an embodiment.

Under one embodiment, an estimate of the loop inductance ($L_{Loop}$) and loop resistance ($R_{Loop}$) are derived. Reference is made to the transmit circuit shown in FIG. 1. The transmit circuit of FIG. 1 is excited with a reference step and the response $V_C(t)$ is analyzed. FIG. 17 shows voltage amplitudes $V_{out}$ [~2V] and $V_C$ [~0.75V] as a function of time (seconds).

$$V_C(\text{final value}) = V_{Out}(\text{final value}) * R_{Sense} / (R_{Sense} + R_{Loop} + R_{Series}) \quad (25)$$

$$R_{Loop} = \left(\frac{V_{Out}}{V_C}\right) * R_{Sense} - R_{Sense} - R_{Series} \quad (26)$$

For a long wire circuit employed under the embodiment described herein, the $R_{series}$ is in the range of 90-180 ohms and $R_{sense}$ is 30 ohms.

Averaging multiple measurements yields a good approximation of $R_{Loop}$ under an embodiment. The transmit loop time constant may be used to approximate the value of $L_{Loop}$. The transmit loop time constant may be expressed as $T_C = L/R$. In one time constant $T_C = L/R$), $V_C(t)$ reaches 63.2% of its final value. Under an embodiment, the elapsed time, $\Delta t1$, is recorded when $V_C(t)$ reaches 63.2% of its final value. In two time constants, $V_C(t)$ reaches 86.5% of its final value. Under an embodiment, the elapsed time, $\Delta t2$, is recorded when $V_C(t)$ reaches 86.5% of its final value. $L_{Loop}$ is calculated as follows:

$$L_{Loop} = R_{Circuit} * \Delta t1 \quad (27)$$

$$L_{Loop} = R_{Circuit} * \Delta t2/2 \quad (28)$$

where $R_{circuit} = R_{series} R_{sense} R_{Loop}$. Averaging multiple measurements yields a good approximation of $L_{Loop}$.

The measurement interval can be long (as compared to the interval between data transmissions) and left to the discretion of the system designer. In general, changes in the loop parameters (other than an open circuit) do not occur suddenly. Open circuits can be detected by observing $V_C(t)$ during all other active periods.

Scale the Approximation $AI_L(n\Delta t)$ and Calculate First Iteration of $V_{Gen}(n\Delta t)$.

A working animal containment system requires a minimum receive signal at a distance x from the transmit loop. Under an embodiment, the necessary amplitude of the two carrier approximation, $AI_L(n\Delta t)$ is calculated.

$$V_{Receive-required} = \text{Gain}_{sensor+amp}(F_C, 2F_C) * V_{Sensor-required} \quad (29)$$

$$V_{Receive-required} = \text{Gain}_{sensor+amp}(F_C, 2F_C) * \Delta I_L / \Delta t\_\text{required} * K_{Rx} * K_{Tx(\#)} \quad (30)$$

$$\Delta I_L / \Delta t\_\text{required} = V_{Receive-required} / (\text{Gain}_{sensor+amp}(F_C, 2F_C) * K_{Rx} K_{Tx(\#)}) \quad (31)$$

where, $\text{Gain}_{sensor+amp}$ ($F_C$, $2F_C$)=sensor plus amplifier gain at the frequency or band of interest.

$K_{Rx} = n * A * u_{C-Rx}$ $K_{Tx(\#)}$=is dependent on the distance, x, and the source type[1]

$\Delta$=the discrete time differentiation operator

[1] It is either $K_{Tx\text{-long wire}}$, $K_{Tx\text{-coil air}}$, or $K_{Tx\text{-coil ferrite}}$.

Under the embodiment described below, $V_{Receive-required}$ ~18.6 mVRMS $\text{Gain}_{sensor+amp}$ ($F_C$, $2F_C$) ~2550 n~950

A~1.164e—5 square meters $u_{(c-Rx)}$ ~5.523

The sensor plus amplifier needs to be responsive from $F_C$ to $2F_C$. A relatively flat response is ideal, but other response characteristics (gain and phase) may be compensated for by digital signal processing in the receiver's microprocessor.

Under an embodiment, solve for the load current scaling factor, $K_I$:

$$\Delta I_L/\Delta t\_\text{required} = K_I * \Delta AI_L/\Delta t\_\text{peak} \quad (32)$$

$$K_I = \Delta I_L/\Delta t\_\text{required}/(\Delta AI_L/\Delta t\_\text{peak}). \quad (33)$$

The resulting loop current is therefore, $AI_L(n\Delta t) = K_I * (\sin(\omega n\Delta t) + 0.3060 * \sin(2\omega n\Delta t))$. Under an embodiment, $V_{Gen}(n\Delta t)$ is calculated using Kirchhoff's law, i.e. by $$V_{Gen}(n\Delta t) = K_I * (R_{circuit} * AI_L(n\Delta t) + L_{Loop} * \Delta AI_L(n\Delta t)/\Delta t)). \quad (34)$$

Under one embodiment the first iteration of the signal generator voltage waveform, $V_{Gen}(n\Delta t)$, may be employed as the generator signal for system operation. One may stop here if there is high confidence the estimated loop parameters adequately reflect the circuit operating conditions for achieving the desired amplitude and asymmetry.

Figure 18:
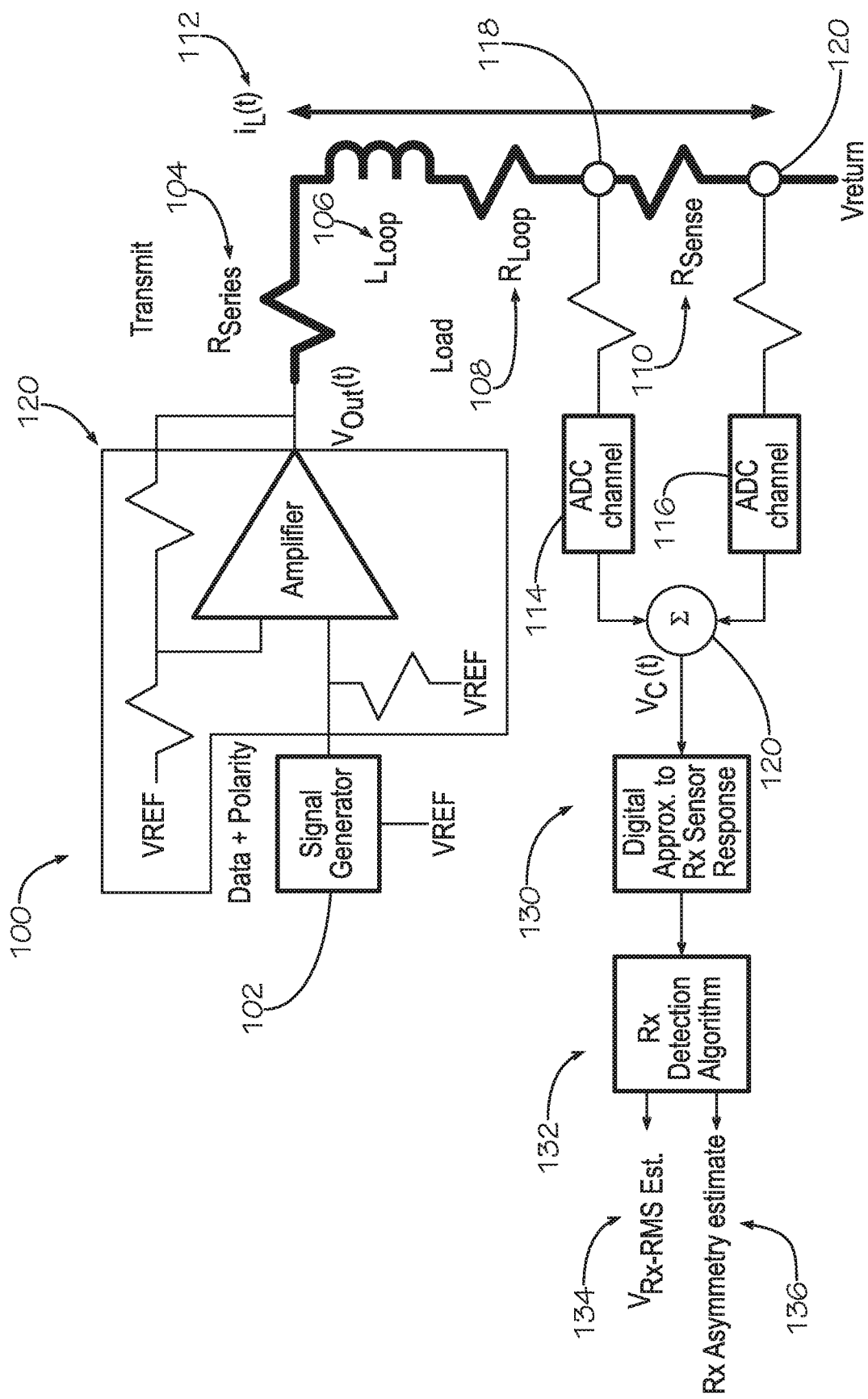
FIG. 18 shows a transmit circuit, under an embodiment.

Observe $V_C(n\Delta t)$ for the Desired Characteristics in the Transmit Loop Current $AI_L(n\Delta t)$ Under an embodiment, one may observe $V_C(n\Delta t)$ for the desired characteristics in the transmit loop current $AI_L(n\Delta t)$. FIG. 18 shows the same transmit circuit as displayed in FIG. 1 with additional elements to model the receiver signal processing using $V_C(n\Delta t)$. As seen in FIG. 18, the $V_C(n\Delta t)$ signal outputs to a digital component 130 that approximates the Receiver (Rx) Sensor Response. The digital approximation is sufficiently modeled as a single pole high pass filter ($f_{corner}$=2525 Hz) followed by a single pole low pass filter ($f_{corner}$=38870 Hz) and a gain of 2550. As seen in FIG. 18, the digital approximation component 130 outputs to the Receiver (Rx) Detection Component/Algorithm 132. The receiver detection component/algorithm generates the weighted and time shifted sum of two bandpass filter outputs. One centered at the fundamental carrier frequency and one centered at 2× the fundamental carrier frequency. A relative time shift between the two filter outputs is required to match the difference in group delay through each bandpass filter. The receiver detection algorithm (also referred to as the feedback detection algorithm) estimates the root means square, $V_{Rx\text{-}RMS}$ 134 (at the required distance measured in Analog-to-Digital-Converter counts) and Rx Asymmetry Value 136 (ratio of the aggregate negative to positive signal peaks) of the receive signal.

Under one embodiment, an adaptive feedback algorithm seeks a solution to satisfy both the minimum receive signal, $V_{Receive}(n\Delta t)$, and the desired receive asymmetry. In this illustrative example, the desired receive asymmetry will be the ratio of the aggregate positive and aggregate negative peaks of $V_{Receive}(n\Delta t)$.

The two frequency transmit current, $\Delta I_L(n\Delta t)$, can be derived from the observed $V_C(n\Delta t)$ and $R_{Sense}$.

$$\Delta I_L(n\Delta t) = V_C(n\Delta t)/R_{Sense} \quad (35)$$

$$\Delta \Delta I_L(n\Delta t)/\Delta t = [\Delta \Delta I_L(n\Delta t) - \Delta \Delta I_L(n\Delta(t-1))]/\Delta t. \quad (36)$$

The illustrative example that follows is for a long wire (approximately 2500 ft. of 16AWG wire, at an operating frequency of 25000 Hz), where:

$$\Delta \beta/\Delta t = \Delta \Delta I_L(n\Delta t)/\Delta t^*(u_0/2\pi x) \quad (37)$$

where, x=3 meters.

Figure 19:
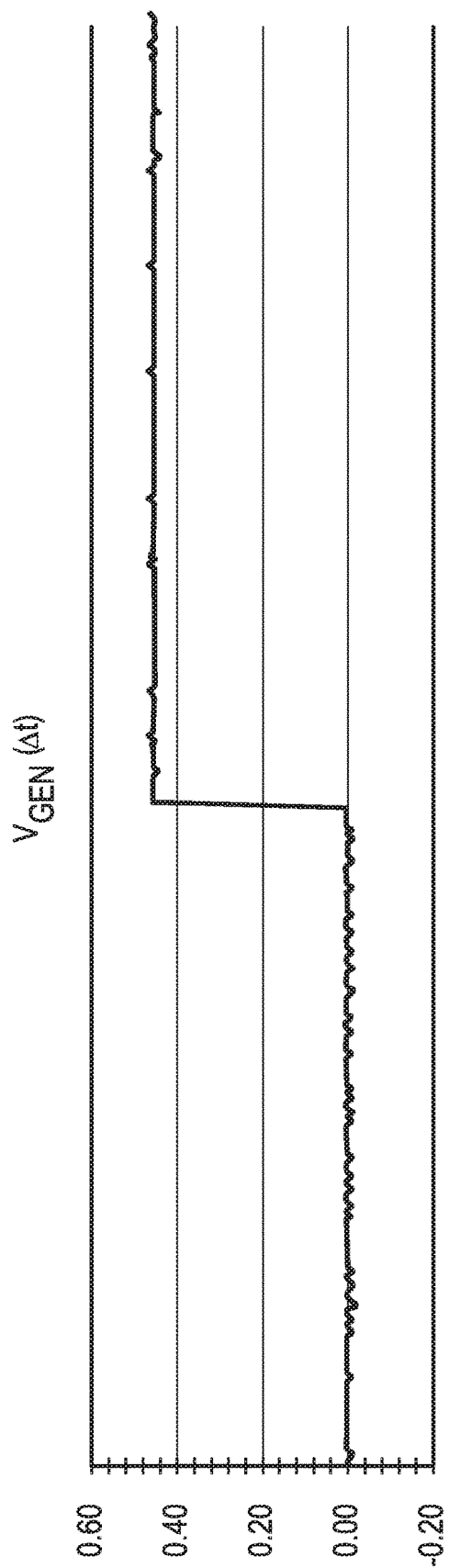
FIG. 19 shows a voltage step waveform, under an embodiment.
Figure 20:
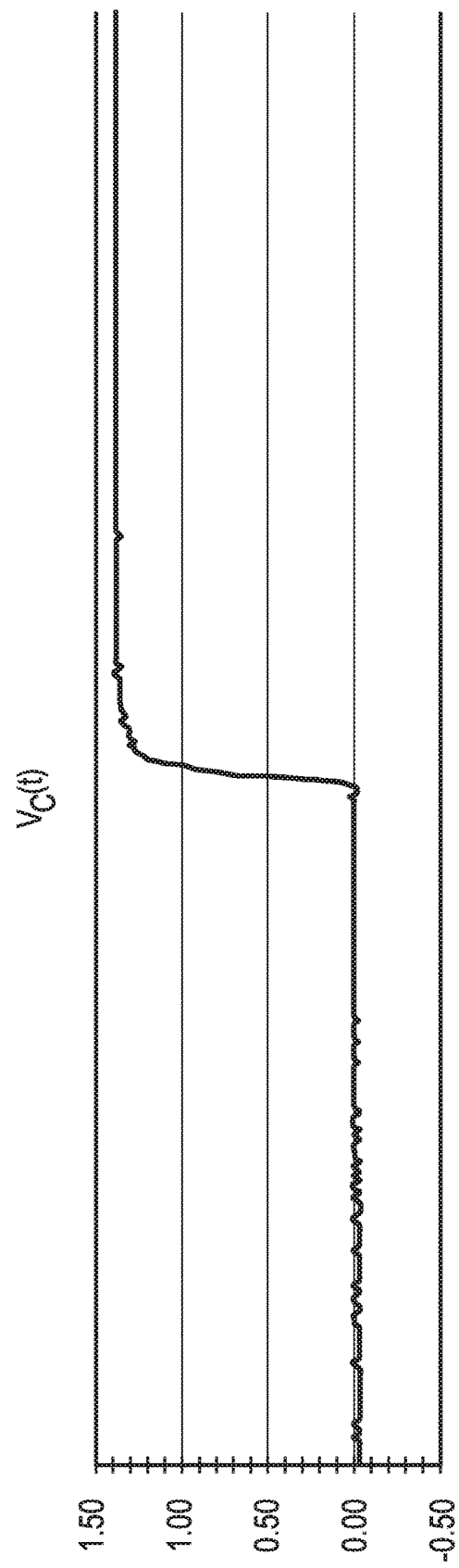
FIG. 20 shows a voltage signal resulting from a voltage step waveform, under an embodiment.

The receive sensor plus amplifier output voltage, $V_{Receive}$ (t), can be generalized as $$V_{Receive}(t) = Gain_{amp}(F_C) * V_{Rx} Sensor(t) = Gain_{amp}(F_C) * K_{Rx} * d\beta/dt \quad (38)$$

$$V_{Receive}(t) = Gain_{amp}(F_C) * \frac{dAI_L(n\Delta t)}{\Delta t} * K_{Rx} * (K_{Tx(\#)}) \quad (39)$$

where,
$Gain_{amp}(F_C)$ = the amplifier gain at the frequency of interest
$K_{Rx} = -n * A * u_{C-Rx}$ (constant receive terms)
n = number of turns in the receive core
A = area of the receive core (m²)
$u_{C-Rx}$ = geometry dependent relative permeability of the receive core
$K_{Tx(\#)}$ is dependent on the source of the time varying magnetic field First, the load parameters are estimated by the previously described analysis of $V_C(n\Delta t)$ when applying a step waveform. FIG. 19 shows a step waveform $V_{GEN}(n\Delta t)$ reaching voltage of approximately 0.44 volts. FIG. 20 shows the corresponding signal $V_C(t)$ reaching a voltage of approximately 1.4 volts.

$R_{LOOP}$ and $R_{CIRCUIT}$ values are then estimated as follows.

$R_{Loop\ estimate}$=17.568Ω

$L_{Loop\ estimate}$=0.001382 H $R_{circuit}=R_{Series}+R_{Sense}+R_{Loop\ estimate}$=195.393

$L_{Circuit}=L_{Loop\ estimate}$=0.001382 H

Under one embodiment, an iterative examination of $V_{GEN}$ (n$\Delta$t) begins with feedback algorithm goals as follows.

$V_{Rx-RMS(at\ required\ distance\ measured\ in\ A/D\ Converter\ counts)}$=7.619+/−6.5%

Rx Asymmetry Ratio$_{(ratio\ of\ the\ aggregate\ negative\ to\ positive\ signal\ peaks)}$=1.692+/−8.55%

The signal generator transmit provides the initial $V_{Gen-0}$ (N$\Delta$t) signal to a transmit circuit comprising starting point circuit parameters of an iterative adaptive feedback algorithm. The starting point circuit parameters, Z(0), under an embodiment are:

$R_{Circuit}$=195.393Ω

$L_{Loop}$=0.001382 H

Figure 21:
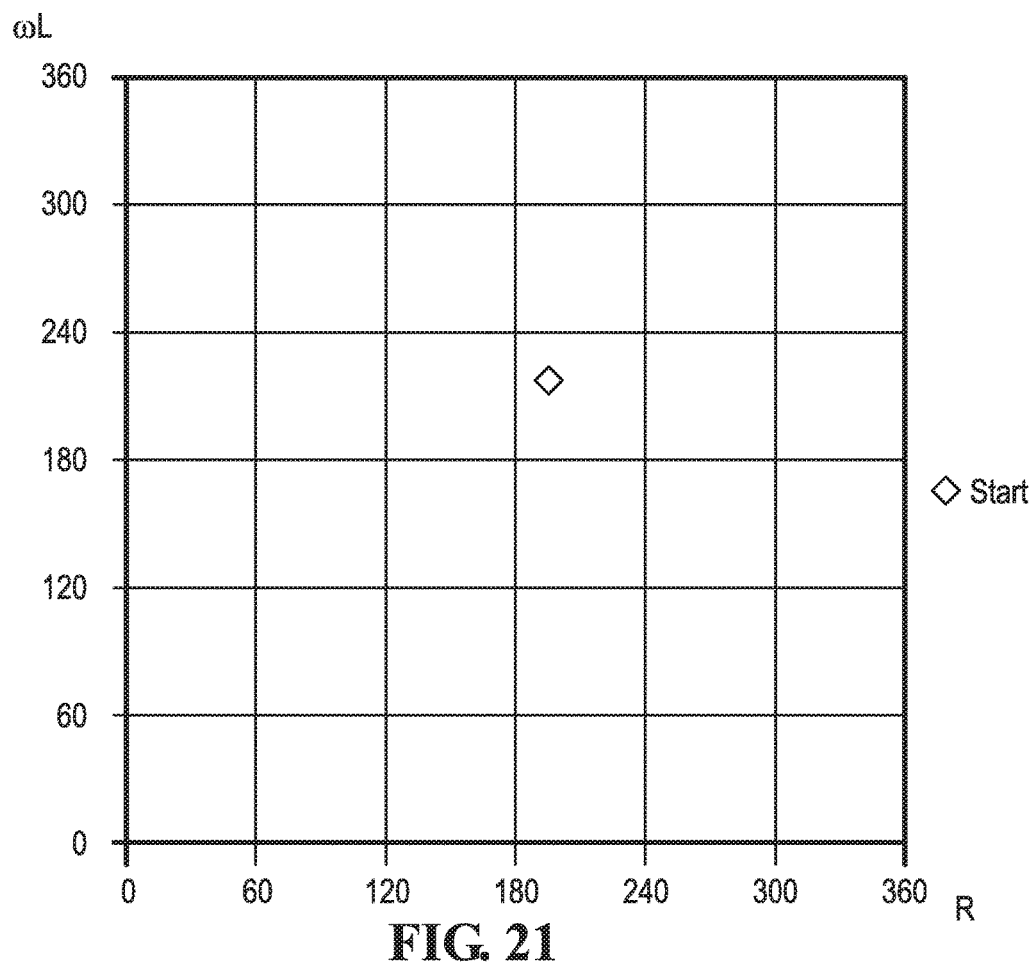
FIG. 21 shows a graph of an impedance vector, under an embodiment.

FIG. 21 shows the initial impedance vector Z(0).

Figure 22:
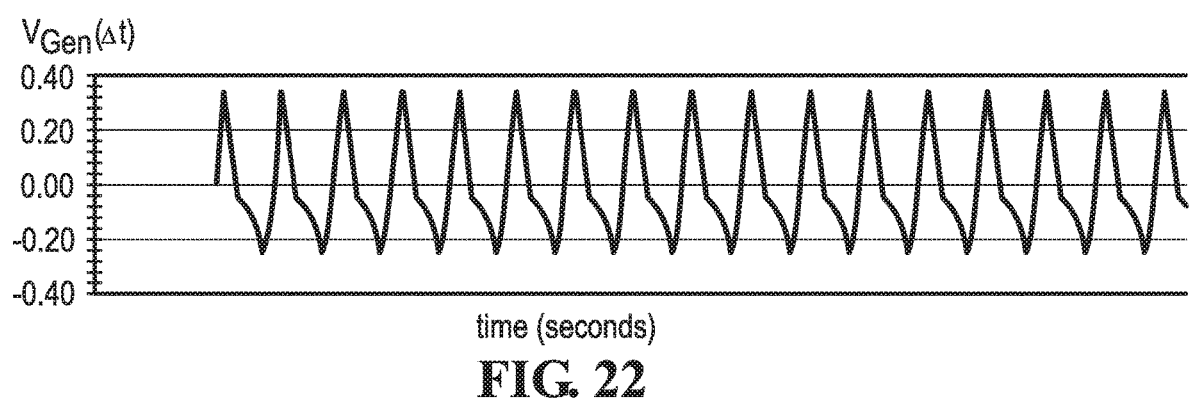
FIG. 22 shows a voltage signal generated by the transmit circuit, under an embodiment.

FIG. 22 shows $V_{Gen-0}(n\Delta t)=K_I*(R_{Circuit}*AI_L(n\Delta t)+L_{Loop}*\Delta AI_L(n\Delta t)/\Delta t))$.

The feedback detection algorithm (see FIG. 18) produces the following receive model output results for $V_{Gen-0}(n\Delta t)$:

$V_{Rx-RMS}$ estimate=8.571

Rx Asymmetry estimate=1.519

The receive signal RMS is not within the acceptable range under an embodiment. When the RMS is not within limits, a scalar gain adjustment is needed. The feedback algorithm will scale the circuit impedance vector accordingly. The scalar gain adjustment is described as follows:

Scalar gain adjustment:

Z=ωL+R $Z(n)=Z(n-1)*V_{Rx-RMS\ goal}/V_{Rx-RMS\ estimate}$ for this example:

$R_{Circuit}$(1)=195.393Ω*7.619/8.571=173.690Ω

$L_{Loop}$(1)=0.001382 H*7.619/8.571=0.0012285 H=0.001229 H

Under an embodiment, the previously iterated circuit parameters are now:

$R_{circuit}$=173.6901Ω

$L_{Loop}$=0.001229 H

Figure 23:
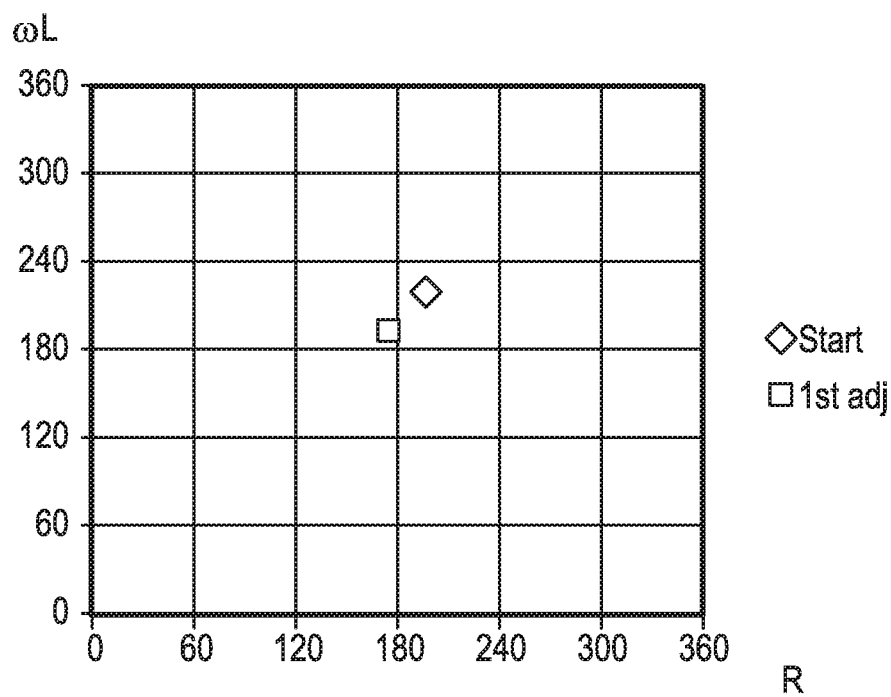
FIG. 23 shows a graph of an impedance vector, under an embodiment.

FIG. 23 shows a graph of the impedance vector Z(1).

The $V_{Gen-1}(n\Delta t)$ signal is then applied to the transmit circuit, where $V_{Gen-1}(n\Delta t)=K_I*(R_{circuit}*AI_L(n\Delta t)+L_{Loop}*\Delta AI_L(n\Delta t)/\Delta t))$.

The feedback detection algorithm produces the following receive model output results for $V_{Gen-1}(n\Delta t)$:

$V_{Rx-RMS}$ estimate=7.546

Rx Asymmetry estimate=1.532

The receive signal asymmetry is not within the acceptable range under an embodiment. When no gain adjustment is required and the asymmetry is not within limits, an impedance vector rotation is needed. The first rotation in an iteration sequence is assumed to be positive. The feedback algorithm will rotate the circuit impedance vector accordingly.

The Z(1) impedance vector has an angle of 48.01 degrees. There is no correlation between the asymmetry error and the proper rotation direction. Our first rotation is assumed to be positive and we rotate one-sixth (⅙) of the degrees between our current angle and 90 degrees. Hence we rotate Z(1) by 7 degrees. The new impedance vector shall have the same magnitude but at an angle of 55.01 degrees.

R(2)=Z(1) Magnitude*cosine(55.01 degrees)

ωL(2)=Z(1) Magnitude*sine(55.01 degrees)

therefore;

L(2)=ωL(2)/ω.

Note that there is nothing sacred about rotating ⅙ of the degrees between the current angle and the hard boundary (0 or 90 degrees). It is a compromise between the number of iterations required to achieve a suitable end result, and the precision of the end result.

Under an embodiment, the previously iterated circuit parameters are now:

$R_{circuit}$=148.884Ω

$L_{Loop}$=0.001354 H

Figure 24:
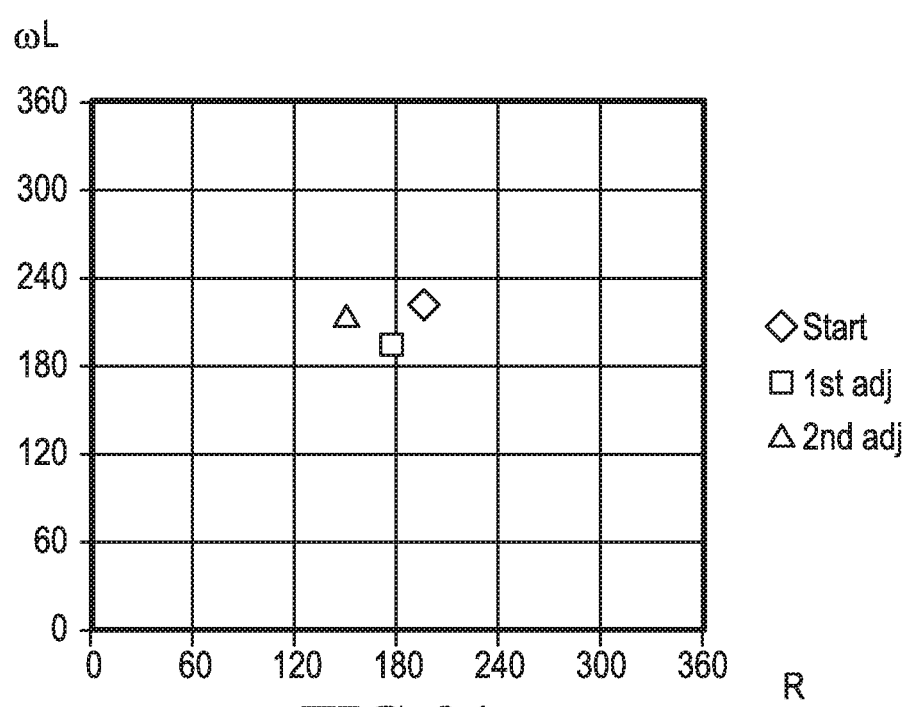
FIG. 24 shows a graph of an impedance vector, under an embodiment.

FIG. 24 shows a graph of the impedance vector Z(2).

The $V_{Gen-2}(n\Delta t)$ signal is then applied to the transmit circuit, where $V_{Gen-2}(n\Delta t)=K_I*(R_{circuit}*AI_L(n\Delta t)+L_{Loop}*\Delta AI_L(n\Delta t)/\Delta t))$.

The feedback detection algorithm produces the following receive model output results for $V_{Gen-2}(n\Delta t)$:

$V_{Rx-RMS}$ estimate=7.546

Rx Asymmetry estimate=1.532

The receive signal asymmetry is not within the acceptable range under an embodiment. When no gain adjustment is required and the asymmetry is not within limits, an impedance vector rotation is needed. Positive rotation did not improve the asymmetry. Therefore, a negative rotation is used. The feedback algorithm will rotate the circuit impedance vector accordingly.

The Z(2) impedance vector has an angle of 55.01 degrees. Our first rotation was assumed to be positive. It did not improve the asymmetry result, therefore we must rotate in the negative direction. Rotate one-sixth (⅙) of the degrees between our current angle and 0 degrees. Hence we rotate Z(2) by 9.71 degrees. The new impedance vector shall have the same magnitude but at an angle of 45.84 degrees.

R(3)=Z(2) Magnitude*cosine(45.84 degrees)
ωL(3)=Z(2) Magnitude*sine(45.84 degrees)
therefore;
L(3)=ωL(3)/ω.

Figure 25:
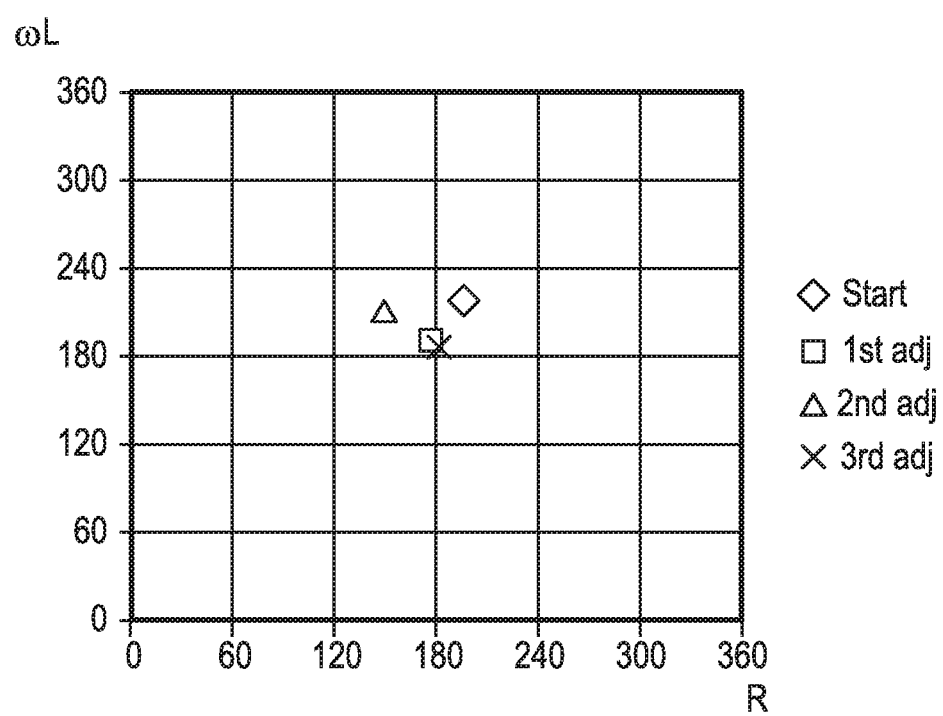
FIG. 25 shows a graph of an impedance vector, under an embodiment.

Under an embodiment, the previously iterated circuit parameters are now:
$R_{circuit}$=180.872Ω
$L_{Loop}$=0.001186 H FIG. 25 shows a graph of the impedance vector Z(3).

The $V_{Gen-3}$ (nΔt) signal is then applied to the transmit circuit, where $V_{Gen-3}$ (nΔt)=$K_I$*($R_{circuit}$*$AI_L$(nΔt)+$L_{Loop}$*$\Delta AI_L$(nΔt)/Δt)).

The feedback detection algorithm produces the following receive model output results for $V_{Gen-3}$(nΔt):
$V_{Rx-RMS}$ estimate=7.7092
Rx Asymmetry estimate=1.582

The receive signal RMS and asymmetry are within acceptable ranges. The adaptive feedback algorithm is complete under an embodiment. The correct circuit parameters for normal operation are:
$R_{circuit}$=180.872Ω
$L_{Loop}$=0.001186 H Also notice that the circuit impedance vector for the $3^{rd}$ and final iteration is neither predominantly inductive or resistive. Therefore, the required $V_{Gen-3}$(nΔt) is neither an "uneven duty cycle square wave" nor a "triangle wave with adjustable slopes".

A method is described herein that comprises describing a load current with a discrete time function. The method includes using a first frequency and a second frequency to provide an approximation of the described load current, wherein a transform applied to the discrete time function identifies the first frequency and the second frequency. The method includes estimating a loop inductance and a loop resistance of a wire loop by exciting a transmit circuit with a voltage reference step waveform, wherein the transmit circuit includes the wire loop. The method includes scaling the approximated load current to a level sufficient to generate a minimum receive voltage signal in a receiver at a first distance between the wire loop and the receiver. The method includes generating a first voltage signal using the scaled load current, the estimated loop inductance, and the estimated loop resistance. The method includes exciting the transmit circuit with the first voltage signal.

The estimating the loop inductance and the loop resistance includes under an embodiment monitoring the transmit circuit's current in response to the voltage reference step waveform.

The monitoring the transmit circuit's current includes under an embodiment capturing current amplitude as a function of time in response to the voltage reference step waveform.

The transform comprises a Discrete Fourier Transform under an embodiment.

The first frequency comprises a first harmonic frequency of the described load current under an embodiment.

The second frequency comprises a second harmonic frequency of the described load current under an embodiment.

The method comprises under an embodiment generating a first carrier component of the approximated load current using the first harmonic frequency, wherein the first carrier component has a weight of one.

The method comprises under an embodiment generating a second carrier component of the approximated load current using the second harmonic frequency, wherein an amplitude of the second carrier component is weighted relative to an amplitude of the first carrier component.

The transform applied to the discrete time function used to describe the load current identifies under an embodiment the relative weight of the second carrier component.

The providing the approximation of the described load current includes summing the first carrier component and the second carrier component under an embodiment.

The approximated load current comprises a discrete time function under an embodiment.

The first voltage signal comprises a discrete time function under an embodiment.

An input to the discrete time function used to describe the load current comprises a rotating phasor under an embodiment.

The phasor value periodically rotates between 0 and 2π radians under an embodiment.

The discrete time function used to describe the load current has a first slope when the phasor value is within a first range under an embodiment.

The first slope is positive under an embodiment.

The discrete time function used to describe the load current has a second slope when the phasor value is within a second range under an embodiment.

The second slope is negative under an embodiment.

The first range comprises approximately thirty percent of 2π radians under an embodiment.

The absolute value of the first slope is greater than the absolute value of the second slope under an embodiment.

The method comprises under an embodiment reading a voltage signal at a location in the transmit circuit, wherein the voltage signal is representative of a corresponding transmit current in the transmit circuit.

The method comprises under an embodiment processing the voltage signal to estimate the receive voltage signal.

The estimating includes under an embodiment determining a root mean square (RMS) of the estimated receive voltage signal.

The estimating includes under an embodiment determining an asymmetry of the estimated receive voltage signal.

The asymmetry comprises under an embodiment a ratio of the aggregate positive and aggregate negative peaks of the estimated receive voltage signal.

The method comprises establishing a target RMS value under an embodiment.

A target RMS range comprises under an embodiment the target RMS value plus or minus a percentage.

The method of an embodiment comprises establishing a target asymmetry value.

A target asymmetry range comprises under an embodiment the target asymmetry value plus or minus a percentage.

The method under an embodiment comprises iteratively adjusting an impedance vector of the transmit circuit until the RMS and the asymmetry of estimated receive voltage signal fall within the corresponding target RMS and asymmetry ranges, wherein the impedance vector initially comprises the loop resistance and the loop inductance.

The adjusting comprises under an embodiment scaling the impedance vector when the RMS falls outside the target RMS range.

The adjusting comprises under an embodiment rotating a phase angle of the impedance vector when the asymmetry falls outside the target asymmetry range.

The rotating the phase angle comprising under an embodiment a negative rotation.

The rotating the phase angle comprises under an embodiment a positive rotation.

The described load current comprises an asymmetry under an embodiment.

The receiver exploits under an embodiment the asymmetry to determine the receiver's direction of approach to the wire loop carrying the described load current.

Computer networks suitable for use with the embodiments described herein include local area networks (LAN), wide area networks (WAN), Internet, or other connection services and network variations such as the world wide web, the public internet, a private internet, a private computer network, a public network, a mobile network, a cellular network, a value-added network, and the like. Computing devices coupled or connected to the network may be any microprocessor controlled device that permits access to the network, including terminal devices, such as personal computers, workstations, servers, mini computers, main-frame computers, laptop computers, mobile computers, palm top computers, hand held computers, mobile phones, TV set-top boxes, or combinations thereof. The computer network may include one or more LANs, WANs, Internets, and computers. The computers may serve as servers, clients, or a combination thereof.

The apparatus, systems and methods for generating voltage excitation waveforms can be a component of a single system, multiple systems, and/or geographically separate systems. The apparatus, systems and methods for generating voltage excitation waveforms can also be a subcomponent or subsystem of a single system, multiple systems, and/or geographically separate systems. The components of the apparatus, systems and methods for generating voltage excitation waveforms can be coupled to one or more other components (not shown) of a host system or a system coupled to the host system.

One or more components of the apparatus, systems and methods for generating voltage excitation waveforms and/or a corresponding interface, system or application to which the apparatus, systems and methods for generating voltage excitation waveforms is coupled or connected includes and/or runs under and/or in association with a processing system. The processing system includes any collection of processor-based devices or computing devices operating together, or components of processing systems or devices, as is known in the art. For example, the processing system can include one or more of a portable computer, portable communication device operating in a communication network, and/or a network server. The portable computer can be any of a number and/or combination of devices selected from among personal computers, personal digital assistants, portable computing devices, and portable communication devices, but is not so limited. The processing system can include components within a larger computer system.

The processing system of an embodiment includes at least one processor and at least one memory device or subsystem. The processing system can also include or be coupled to at least one database. The term "processor" as generally used herein refers to any logic processing unit, such as one or more central processing units (CPUs), digital signal processors (DSPs), application-specific integrated circuits (ASIC), etc. The processor and memory can be monolithically integrated onto a single chip, distributed among a number of chips or components, and/or provided by some combination of algorithms. The methods described herein can be implemented in one or more software algorithm(s), programs, firmware, hardware, components, circuitry, in any combination.

The components of any system that include the apparatus, systems and methods for generating voltage excitation waveforms can be located together or in separate locations. Communication paths couple the components and include any medium for communicating or transferring files among the components. The communication paths include wireless connections, wired connections, and hybrid wireless/wired connections. The communication paths also include couplings or connections to networks including local area networks (LANs), metropolitan area networks (MANs), wide area networks (WANs), proprietary networks, interoffice or backend networks, and the Internet. Furthermore, the communication paths include removable fixed mediums like floppy disks, hard disk drives, and CD-ROM disks, as well as flash RAM, Universal Serial Bus (USB) connections, RS-232 connections, telephone lines, buses, and electronic mail messages.

Aspects of the apparatus, systems and methods for generating voltage excitation waveforms and corresponding systems and methods described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the apparatus, systems and methods for generating voltage excitation waveforms and corresponding systems and methods include: microcontrollers with memory (such as electronically erasable programmable read only memory (EEPROM)), embedded microprocessors, firmware, software, etc. Furthermore, aspects of the apparatus, systems and methods for generating voltage excitation waveforms and corresponding systems and methods may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

It should be noted that any system, method, and/or other components disclosed herein may be described using computer aided design tools and expressed (or represented), as data and/or instructions embodied in various computer-readable media, in terms of their behavioral, register transfer, logic component, transistor, layout geometries, and/or other characteristics. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). When received within a computer system via one or more computer-readable media, such data and/or instruction-based expressions of the above described components may be processed by a processing entity (e.g., one or more processors) within the computer system in conjunction with execution of one or more other computer programs.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import, when used in this application, refer to this application as a whole and not to any particular portions of this application. When the word "or" is used in reference to a list of two or more items, that word covers all of the following interpretations of the word: any of the items in the list, all of the items in the list and any combination of the items in the list.

The above description of embodiments of the apparatus, systems and methods for generating voltage excitation waveforms is not intended to be exhaustive or to limit the systems and methods to the precise forms disclosed. While specific embodiments of, and examples for, the apparatus, systems and methods for generating voltage excitation waveforms and corresponding systems and methods are described herein for illustrative purposes, various equivalent modifications are possible within the scope of the systems and methods, as those skilled in the relevant art will recognize. The teachings of the apparatus, systems and methods for generating voltage excitation waveforms and corresponding systems and methods provided herein can be applied to other systems and methods, not only for the systems and methods described above.

The elements and acts of the various embodiments described above can be combined to provide further embodiments. These and other changes can be made to the apparatus, systems and methods for generating voltage excitation waveforms and corresponding systems and methods in light of the above detailed description.

We claim:

1. A method comprising,
one or more applications running on at least one processor for providing,
describing a load current with a discrete time function;
using a first frequency and a second frequency to provide an approximation of the described load current, wherein a transform applied to the discrete time function identifies the first frequency and the second frequency;
estimating a loop inductance and a loop resistance of a wire loop by exciting a transmit circuit with a voltage reference step waveform, wherein the transmit circuit includes the wire loop;
scaling the approximated load current to a level sufficient to generate a minimum receive voltage signal in a receiver at a first distance between the wire loop and the receiver;
generating a first voltage signal using the scaled load current, the estimated loop inductance, and the estimated loop resistance;
exciting the transmit circuit with the first voltage signal;
reading a voltage signal at a location in the transmit circuit, wherein the voltage signal is representative of a corresponding transmit current in the transmit circuit; and
processing the voltage signal to estimate a receive voltage signal, the estimating including determining an asymmetry of the estimated receive voltage signal.

2. The method of claim 1, wherein the estimating the loop inductance and the loop resistance includes monitoring the transmit circuit's current in response to the voltage reference step waveform.

3. The method of claim 2, wherein the monitoring the transmit circuit's current includes capturing current amplitude as a function of time in response to the voltage reference step waveform.

4. The method of claim 1, wherein the transform comprises a Discrete Fourier Transform.

5. The method of claim 1, wherein the first frequency comprises a first harmonic frequency of the described load current.

6. The method of claim 5, wherein the second frequency comprises a second harmonic frequency of the described load current.

7. The method of claim 6, comprising generating a first carrier component of the approximated load current using the first harmonic frequency, wherein the first carrier component has a weight of one.

8. The method of claim 7, comprising generating a second carrier component of the approximated load current using the second harmonic frequency, wherein an amplitude of the second carrier component is weighted relative to an amplitude of the first carrier component.

9. The method of claim 8, wherein the transform applied to the discrete time function used to describe the load current identifies the relative weight of the second carrier component.

10. The method of claim 8, wherein the providing the approximation of the described load current includes summing the first carrier component and the second carrier component.

11. The method of claim 1, wherein the approximated load current comprises a discrete time function.

12. The method of claim 1, wherein the first voltage signal comprises a discrete time function.

13. The method of claim 1, wherein an input to the discrete time function used to describe the load current comprises a rotating phasor.

14. The method of claim 13, wherein the phasor value periodically rotates between 0 and $2\pi$ radians.

15. The method of claim 14, wherein the discrete time function used to describe the load current has a first slope when the phasor value is within a first range.

16. The method of claim 15, wherein the first slope is positive.

17. The method of claim 15, wherein the discrete time function used to describe the load current has a second slope when the phasor value is within a second range.

18. The method of claim 15, wherein the second slope is negative.

19. The method of claim 15, wherein the first range comprises approximately thirty percent of $2\pi$ radians.

20. The method of claim 19, wherein the absolute value of the first slope is greater than the absolute value of the second slope.

21. The method of claim 1, the estimating including determining a root mean square (RMS) of the estimated receive voltage signal.

22. The method of claim 21, wherein the asymmetry comprises a ratio of the aggregate positive and aggregate negative peaks of the estimated receive voltage signal.

23. The method of claim 21, comprising establishing a target RMS value.

24. The method of claim 23, wherein a target RMS range comprises the target RMS value plus or minus a percentage.

25. The method of claim 24, comprising establishing a target asymmetry value.

26. The method of claim 25, wherein a target asymmetry range comprises the target asymmetry value plus or minus a percentage.

27. The method of claim 26, comprising iteratively adjusting an impedance vector of the transmit circuit until the RMS and the asymmetry of the estimated receive voltage signal fall within the corresponding target RMS and asymmetry ranges, wherein the impedance vector initially comprises the loop resistance and the loop inductance.

28. The method of claim 27, the adjusting comprising scaling the impedance vector when the RMS falls outside the target RMS range.

29. The method of claim 27, the adjusting comprising rotating a phase angle of the impedance vector when the asymmetry falls outside the target asymmetry range.

30. The method of claim 29, the rotating the phase angle comprising a negative rotation.

31. The method of claim 29, the rotating the phase angle comprising a positive rotation.

32. The method of claim 1, wherein the described load current comprises an asymmetry.

33. The method of claim 32, wherein the receiver exploits the asymmetry to determine the receiver's direction of approach to the wire loop carrying the described load current.

* * * * *